(12) United States Patent
Gu

(10) Patent No.: US 11,626,869 B2
(45) Date of Patent: Apr. 11, 2023

(54) COMPARATOR AND DECISION FEEDBACK EQUALIZATION CIRCUIT

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/709,761

(22) Filed: Mar. 31, 2022

(65) Prior Publication Data

US 2023/0008644 A1 Jan. 12, 2023

Related U.S. Application Data

(63) Continuation of application No. PCT/CN2021/117035, filed on Sep. 7, 2021.

(30) Foreign Application Priority Data

Jul. 12, 2021 (CN) .......................... 202110785565.5

(51) Int. Cl.
*H03K 5/24* (2006.01)
*H04L 25/03* (2006.01)

(52) U.S. Cl.
CPC ........... *H03K 5/2481* (2013.01); *H03K 5/249* (2013.01); *H04L 25/03057* (2013.01)

(58) Field of Classification Search
CPC ............. G01R 19/0038; H03K 5/2418; H03K 5/2445; H03K 5/2481

(Continued)

(56) References Cited

U.S. PATENT DOCUMENTS 4,845,675 A * 7/1989 Krenik ................. G11C 7/1051
365/205
10,079,611 B1 9/2018 Yang et al.
(Continued)

FOREIGN PATENT DOCUMENTS

CN 106026996 A * 10/2016 ............... H03K 5/22
CN 106374929 A 2/2017
(Continued)

OTHER PUBLICATIONS

Young-Ju Kim et al, ISSCC 2018 / Session 12 / DRAM / 12.1, "A 16Gb 18Gb/s/pin GDDR6 DRAM with Per-Bit Trainable Single-Ended DFE and PLL-Less Clocking", Samsung Electronics, Hwaseong, Korea, ISSCC 2018 / Feb. 13, 2018, 3 pages.

(Continued)

*Primary Examiner* — Quan Tra
(74) *Attorney, Agent, or Firm* — Cooper Legal Group, LLC

(57) ABSTRACT

A comparator includes a second-stage circuit, a first input circuit, a second input circuit, a first cross-coupled circuit and a second cross-coupled circuit. The first input circuit is configured to generate a first data terminal voltage and a first reference terminal voltage. The first cross-coupled circuit is configured to perform mutual positive feedback on the first data terminal voltage and the first reference terminal voltage to generate a first differential signal. The second input circuit is configured to generate a second data terminal voltage and a second reference terminal voltage. The second cross-coupled circuit is configured to perform mutual positive feedback on the second data terminal voltage and the second reference terminal voltage to generate a second differential signal. The second-stage circuit is configured to amplify and latch the first differential signal or the second differential signal in a regeneration phase to output a comparison signal.

16 Claims, 14 Drawing Sheets

(58) Field of Classification Search
USPC .......................................................... 327/65
See application file for complete search history.

(56) References Cited

U.S. PATENT DOCUMENTS

| | | | |
|---|---|---|---|
| 10,389,342 | B2 | 8/2019 | Zhou et al. |
| 2008/0089155 | A1* | 4/2008 | Bae ..................... G11C 7/1078 |
| | | | 365/205 |
| 2018/0262203 | A1 | 9/2018 | Yang et al. |
| 2019/0007037 | A1 | 1/2019 | Zhou et al. |

FOREIGN PATENT DOCUMENTS

| | | |
|---|---|---|
| CN | 108574489 A | 9/2018 |
| CN | 109994146 A | 7/2019 |
| CN | 112187226 A | 1/2021 |

OTHER PUBLICATIONS

Young-Ju Kim et al, "A 16-Gb, 18-Gb/s/pin GDDR6 DRAM With Per-Bit Trainable Single-Ended DFE and PLL-Less Clocking", IEEE Journal of Solid-State Circuits, vol. 54, No. 1, Jan. 2019, 13 pages.

* cited by examiner

COMPARATOR AND DECISION FEEDBACK EQUALIZATION CIRCUIT

CROSS-REFERENCE TO RELATED APPLICATIONS

This is a continuation application of International Patent Application No. PCT/CN2021/117035, filed on Sep. 7, 2021, which claims priority to Chinese patent application No. 202110785565.5, filed on Jul. 12, 2021. The disclosures of International Patent Application No. PCT/CN2021/117035 and Chinese patent application No. 202110785565.5 are hereby incorporated by reference in their entireties.

BACKGROUND

With the increasing development of computer technology, more and more products are controlled by a computer to realize intelligence. However, with the continuous expansion of application scenes, higher requirements are put on performance of computers, including faster operating rate and lower power consumption.

As an indispensable component in a computer hardware system, a memory device is used for storing instructions and data used during computer operation to ensure normal operation of the computer. A comparator is an important component in a commonly used memory device, thus improving performance of the comparator can help to improve the overall performance of the computer.

SUMMARY

Embodiments of the disclosure relate to but are not limited to a comparator and a Decision Feedback Equalization (DFE) circuit.

An embodiment of the disclosure provides a comparator, which includes a second-stage circuit, a first input circuit, a second input circuit, a first cross-coupled circuit and a second cross-coupled circuit.

The first cross-coupled circuit is connected with the first input circuit, and the second cross-coupled circuit is connected with the second input circuit.

The first input circuit and the second input circuit are both connected with the second-stage circuit.

The second-stage circuit is connected to a power supply terminal or a ground terminal.

The first input circuit is configured to generate a first data terminal voltage and a first reference terminal voltage according to an input signal and a first reference signal in a sampling phase when being turned on.

The first cross-coupled circuit is configured to perform mutual positive feedback on the first data terminal voltage and the first reference terminal voltage to generate a first differential signal.

The second input circuit is configured to generate a second data terminal voltage and a second reference terminal voltage according to the input signal and a second reference signal in a sampling phase when being turned on.

The second cross-coupled circuit is configured to perform mutual positive feedback on the second data terminal voltage and the second reference terminal voltage to generate a second differential signal.

The second-stage circuit is configured to amplify and latch the first differential signal or the second differential signal in a regeneration phase to output a comparison signal.

An embodiment of the disclosure provides a DFE circuit, which includes N stages of comparators described in the above solution, N being a positive integer greater than 1.

A first input terminal of a comparator at each stage receives an input signal. A second input terminal of the comparator at each stage receives a first reference signal. A third input terminal of the comparator at each stage receives a second reference signal.

A fourth input terminal of a first-stage comparator is connected with an output terminal of an Nth-stage comparator to receive an Nth-stage comparison signal output by the Nth-stage comparator. A fifth input terminal of the first-stage comparator receives a first clock signal.

A fourth input terminal of an ith-stage comparator is connected with an output terminal of an (i−1)th-stage comparator to receive an (i−1)th-stage comparison signal output by the (i−1)th-stage comparator. A fifth input terminal of the ith-stage comparator receives an ith clock signal, i being greater than 1 and less than or equal to N.

Under trigger of a clock signal at each stage, the comparator at each stage compares the input signal with the first reference signal or compares the input signal with the second reference signal, according to a comparison signal corresponding to a fourth input terminal of the comparator at each stage, to output a comparison signal at each stage.

DETAILED DESCRIPTION

Figure 1:
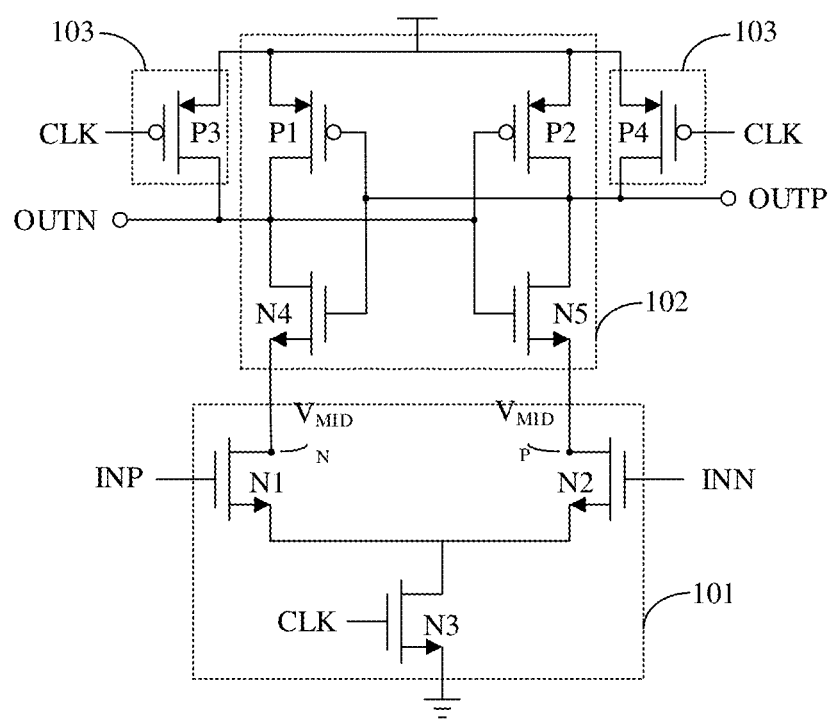
FIG. 1 is a schematic diagram of a structure of a comparator provided in a related technical solution.

FIG. 1 is a schematic diagram of a structure of a comparator in a related art. As illustrated in FIG. 1, a comparator 10 includes an input circuit 101, an output circuit 102 and a reset circuit 103. The input circuit 101 is connected with an input terminal of the output circuit 102. The reset circuit 103 is connected with the output circuit 102.

The input circuit 101 includes a Negative-Metal-Oxide-Semiconductor (NMOS) transistor N1, an NMOS transistor N2 and an NMOS transistor N3. A source of the N1 and a source of the N2 are both connected with a drain of the N3. A source of the N3 is connected to a ground terminal. A gate of the N1 serves as a first input terminal INP of the comparator 10 for receiving an input signal. A gate of the N2 serves as a second input terminal INN of the comparator 10 for receiving a reference signal. A gate of the N3 receives a clock signal CLK. The N1 and the N2 form an input pair that generates differential currents with respect to differential input levels (i.e., an input signal and a reference signal).

The output circuit 102 includes a Positive-Metal-Oxide-Semiconductor (PMOS) transistor P1, a PMOS transistor P2, an NMOS transistor N4 and an NMOS transistor N5. A gate of the P1, a drain of the P2, a gate of the N4 and a drain of the N5 are all connected with a first output terminal OUTP of the comparator 10. A drain of the P1, a gate of the P2, a drain of the N4 and a gate of the N5 are all connected with a second output terminal OUTN of the comparator 10. A source of the P1 and a source of the P2 are both connected to a power supply terminal. A source of the N4 is connected with a drain of the N1, and a source of the N5 is connected with a drain of the N2.

The reset circuit 103 includes a PMOS transistor P3 and a PMOS transistor P4. A drain of the P3 is connected with the second output terminal OUTN of the comparator 10, and a drain of the P4 is connected with the first output terminal OUTP of the comparator 10. A source of the P3 and a source of the P4 are connected to the power supply terminal. A gate of the P3 and a gate of the P4 receive a clock signal CLK respectively.

Figure 2:
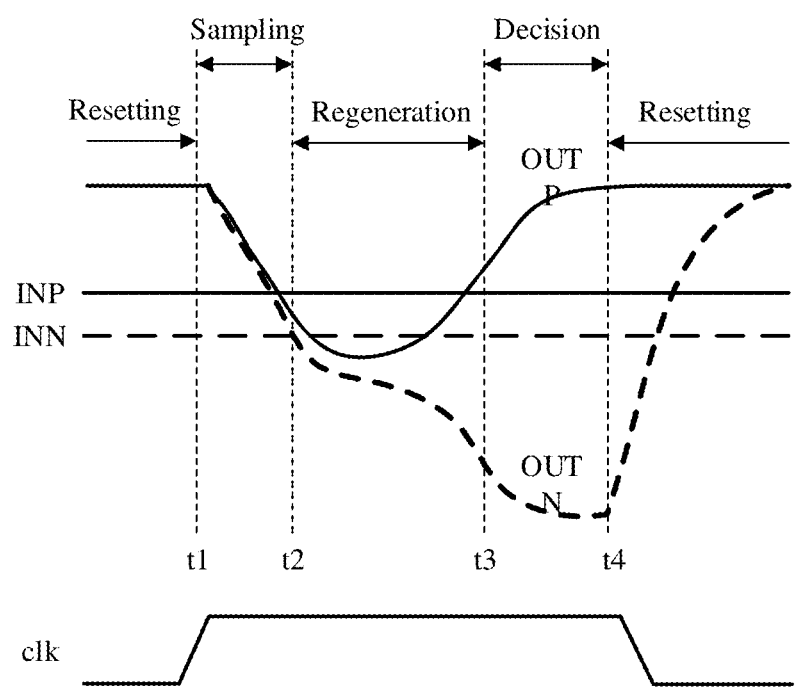
FIG. 2 is a schematic diagram of an operating process of a comparator in a related technical solution.

The operating process of the comparator 10 consists of four phases: a resetting phase, a sampling phase, a regeneration phase and a decision phase. FIG. 2 is an operating timing diagram of the comparator 10. The operating process of the comparator 10 is described below in combination with FIG. 2.

The resetting phase is before time t1. At this phase, the clock signal CLK is at a low level, the N3 is triggered to be turned off by the clock signal CLK, and the input circuit 101 and the output circuit 102 stop operating. Moreover, the P3 and the P4 are both triggered to be turned on by the clock signal CLK, and the reset circuit 103 operates to keep the voltage of the first output terminal OUTP and the voltage of the second output terminal OUTN at a high level.

The sampling phase is from time t1 to time t2. At the beginning of the sampling phase (i.e., the time t1), the clock signal CLK changes to a high level. At this time, the P3 and the P4 are both triggered to be turned off by the clock signal CLK, and the reset circuit stops operating. Moreover, the N3 is triggered to be turned on by the clock signal CLK, then the input circuit 101 and the output circuit 102 operate, the first input terminal INP acquires an input signal, and the second input terminal INN acquires a reference signal. Then, the voltage of the first output terminal OUTP and the voltage of the second output terminal OUTN gradually decrease to a low level due to the effect of the input signal and the reference signal. At the end of the sampling phase (i.e., the time t2), the P1 is triggered to be turned on by the low level of the first output terminal OUTP, and the P2 is triggered to be turned on by the low level of the second output terminal OUTN.

It is to be noted that, in the sampling phase, since the voltages of the input signal and the reference signal are different, the voltage decrease rate of the first output terminal OUTP and the voltage decrease rate of the second output terminal OUTN are different, so that there is a voltage difference between the first output terminal OUTP and the second output terminal OUTN. In FIG. 2, the input signal is higher than the reference signal, thus the voltage of the second output terminal OUTN decreases faster than that of the first output terminal OUTP, as a result, the voltage of the second output terminal OUTN is lower than that of the first output terminal OUTP. It can be understood that, when the input signal is lower than the reference signal, i.e., the voltage of a signal acquired by the first input terminal INP is lower than the voltage of a signal acquired by the second input terminal INN, the voltage of the first output terminal OUTP may decrease faster than that of the second output terminal OUTN. Therefore, the voltage of the first output terminal OUTP may be lower than that of the second output terminal OUTN. On the contrary, when the input signal is higher than the reference signal, that is, the voltage of the signal acquired by the first input terminal INP is higher than the voltage of the signal acquired by the second input terminal INN, the voltage of the first output terminal OUTP may be higher than that of the second output terminal OUTN.

The regeneration phase is from time t2 to time t3. At the beginning of the regeneration phase (i.e., the time t2), the P1 and the P2 are triggered to be turned on, and due to the positive feedback, a cross-coupled inverter composed of the P1 and the P2 amplifies the voltage difference between the first output terminal OUTP and the second output terminal OUTN formed in the sampling phase. Meanwhile, the N1 and the N2 sense the respective differential input levels (i.e., the input signal and the reference signal) and respectively generate differential drain currents, to respectively charge $V_{MIDN}$ and $V_{MIDP}$, such that each of $V_{MIDN}$ and $V_{MIDP}$ has a large signal amplitude change relative to the input polarity. At the end of the regeneration phase (i.e., the time t3), the voltage difference between the first output terminal OUTP and the second output terminal OUTN is amplified to a sufficient extent. Therefore, a high level voltage and a low level voltage are regenerated at the first output terminal OUTP and the second output terminal OUTN, respectively. When the input signal is higher than the reference signal, as illustrated in FIG. 2, i.e., a high level voltage is regenerated at the first output terminal OUTP, and a low level voltage is regenerated at the second output terminal OUTN. When the input signal is lower than the reference signal, a low level voltage is regenerated at the first output terminal OUTP, and a high level voltage is regenerated at the second output terminal OUTN.

The decision phase is from time t3 to time t4. The output circuit 102 latches the level of the first output terminal OUTP and the level of the second output terminal OUTN to hold the levels, then to output the latched levels for the comparison signal.

When the next operating cycle comes (i.e., the time t4), the clock signal changes to a low level, the N3 is triggered to be turned off by the clock signal CLK, and the input circuit 101 and the output circuit 102 stop operating. Meanwhile, the P3 and the P4 are triggered to be turned on by the clock signal CLK, and the reset circuit 103 operates to pull the voltage of the first output terminal OUTP and the voltage of the second output terminal OUTN back to the high level.

As can be seen, the operating process of the comparator is to compare the input signal with the reference signal: when the input signal is higher than the reference signal, a first comparison signal is output; when the input signal is lower than the reference signal, a second comparison signal inverted from the first comparison signal is output. Thus, the level of the input signal can be determined.

Figure 3:
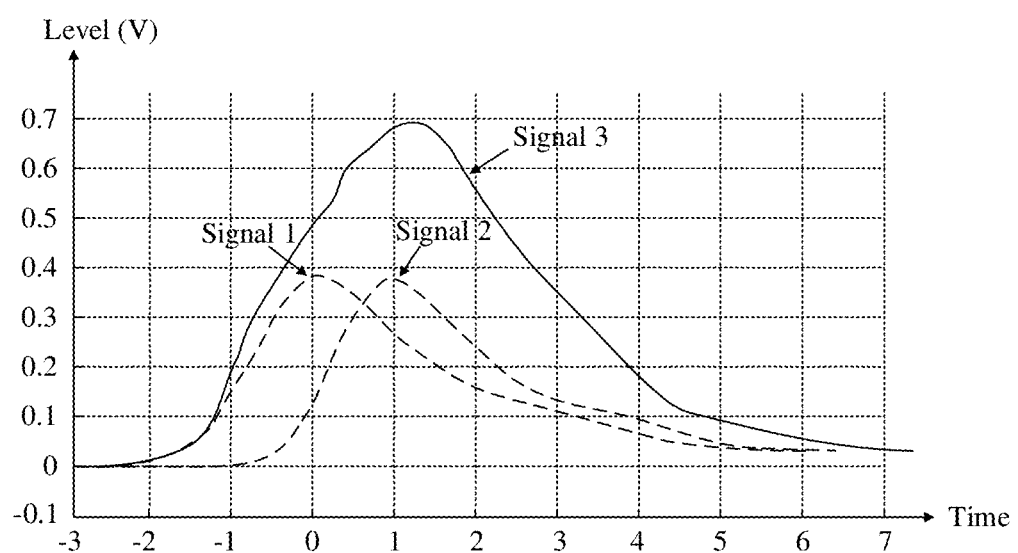
FIG. 3 is a schematic diagram of Inter-Symbol Interference (ISI) in a related technical solution.

It is to be noted that, Inter-Symbol Interference (ISI) may be occurred in the operation of the comparator. ISI is that overall transmission characteristics of a system are not ideal, resulting in waveform distortion and broadening of signals of previous and subsequent time nodes. Therefore, the previous waveform with a long tail may spread to the sampling time of a signal of current time node, which may interfere decision of the signal of the current time node. FIG. 3 is a schematic diagram of the ISI. As illustrated in FIG. 3, the waveform of a signal 1, the waveform of a signal 2 and the waveform of a signal 3 all have a long tail after their respective peak values, and slowly dropping to 0 after several time nodes. Therefore, the decision of a signal of time nodes after the peak value is affected, and a symbol should have been determined as a low level may be determined as a high level.

In digital integrated circuits, binary digital signals "1" and "0" are generally used for realizing the functions in the digital integrated circuits. The comparator may be configured to determine whether the input signal is a digital signal "1" or digital signal "0". When the level of the input signal is higher than that of the reference signal, the input signal is determined as the digital signal "1" (i.e., a high-level signal). When the level of the input signal is lower than that of the reference signal, the input signal is determined as a digital signal "0" (i.e., a low-level signal). Then, when the input signal of the previous time node is the digital signal "1", which is at a high level, thus, the level of an actual input signal of the subsequent time node may be pulled up to be higher than the level at which it should have been. When the input signal of the subsequent time node is the digital signal "0", that is, the level should have been at a low level, however, the actual level may be pulled up to be higher than the reference signal and may be determined as the digital signal "1", resulting in signal distortion. Similarly, when the input signal of the previous time node is the digital signal "0", which is at a low level, thus, the level of an actual input signal of the subsequent time node may decrease to be lower than the level at which it should have been. When the input signal of the subsequent time node is the digital signal "1", that is, the level should have been at a high level, however, the actual level may decrease to be lower than the reference signal and may be determined as the digital signal "0", resulting in signal distortion.

Figure 4:
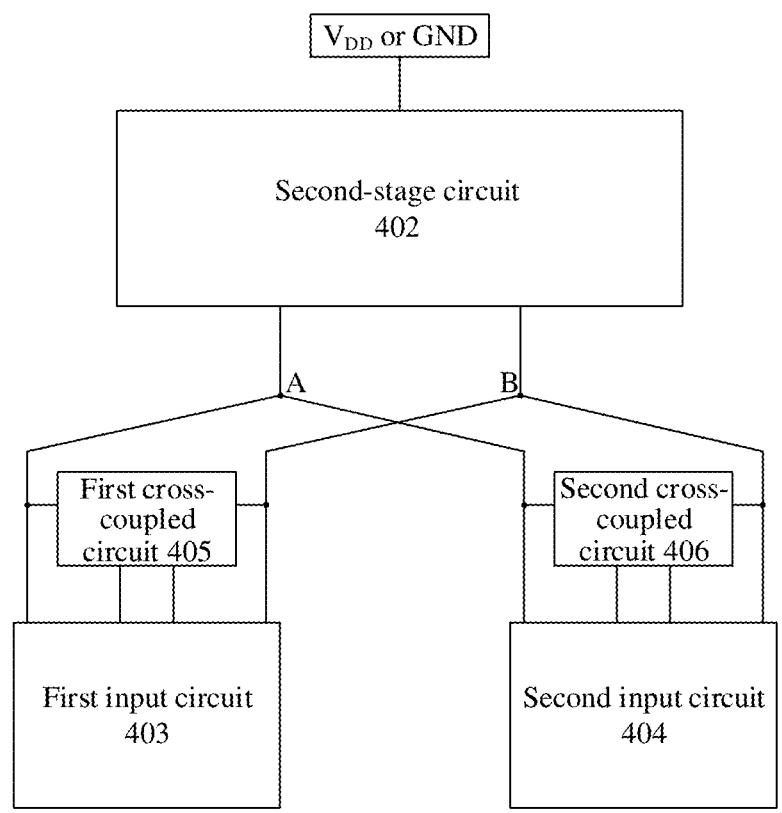
FIG. 4 is a first schematic diagram of a structure of a comparator provided in an embodiment of the disclosure.

FIG. 4 is a schematic diagram of a structure of a comparator provided in an embodiment of the disclosure. As illustrated in FIG. 4, the comparator 40 includes a second-stage circuit 402, a first input circuit 403, a second input circuit 404, a first cross-coupled circuit 405 and a second cross-coupled circuit 406.

The first cross-coupled circuit 405 is connected with the first input circuit 403. The second cross-coupled circuit 406 is connected with the second input circuit 404. The first input circuit 403 and the second input circuit 404 are both connected with the second-stage circuit 402. The second-stage circuit 402 is connected to a power supply terminal $V_{DD}$ or a ground terminal GND.

It is to be noted that, as electronic components used in the comparator 40 change, the ground terminal or the power supply terminal connected to the second-stage circuit 402 may also change. When the comparator 40 adopts an electronic component solution, the second-stage circuit 402 may be connected to the power supply terminal; when the comparator 40 adopts another electronic component solution, the second-stage circuit 402 may be connected to the ground terminal, which is not limited herein.

In the embodiment of the disclosure, the first input circuit 403 receives an input signal DQ and a first reference signal $V_{REF\_}1$, and the first input circuit is configured to generate a first data terminal voltage and a first reference terminal voltage according to the input signal DQ and the first reference signal $V_{REF\_}1$ in the sampling phase when being turned on. The first cross-coupled circuit 405 is configured to perform mutual positive feedback on the first data terminal voltage and the first reference terminal voltage to generate a first differential signal. The second input circuit 404 receives the input signal DQ and a second reference signal $V_{REF\_}2$, and the second input circuit is configured to generate a second data terminal voltage and a second reference terminal voltage according to the input signal DQ and the second reference signal $V_{REF\_}2$ in the sampling phase when being turned on. The second cross-coupled circuit 406 is configured to perform mutual positive feedback on the second data terminal voltage and the second reference terminal voltage to generate a second differential signal. The second-stage circuit 402 is configured to amplify and latch a first differential signal or a second differential signal in a regeneration phase to output a comparison signal. The comparison signal includes a first comparison sub-signal $F_i$ and a second comparison sub-signal $F_iB$. The $F_i$ and the $F_iB$ are signals inverted from each other.

In the embodiment of the disclosure, the comparator 40 employs two different reference signals, namely the first reference signal $V_{REF\_}1$ and the second reference signal $V_{REF\_}2$. The $V_{REF\_}1$ is higher than or lower than the $V_{REF\_}2$. Correspondingly, the comparator 40 provided in the embodiment of the disclosure may implement two circuit solutions. At the same time, the $V_{REF\_}1$ and the $V_{REF\_}2$ are both lower than the high level of the input signal DQ and higher than the low level of the input signal DQ. The specific voltages of the two reference signals $V_{REF\_}1$ and $V_{REF\_}2$ may be set according to the actual needs, which is not limited herein.

For example, the comparator 40 employs a circuit solution that the $V_{REF\_}1$ is higher than the $V_{REF\_}2$. When the DQ of the previous time node is at a high level, in the sampling phase of the DQ on the current time node, the first input circuit 403 is triggered to be turned on by a first feedback signal $F_{i-1}$, the second input circuit 404 is triggered to be turned off by a second feedback signal $F_{i-1}B$, and the $V_{REF\_}1$ is compared with the DQ. Then, when the DQ of the current time node is at a low level, the DQ of the current time node may not be higher than the $V_{REF\_}1$ after being pulled up since the $V_{REF\_}1$ is relatively high. Therefore, the DQ may still be determined as the digital signal "0", and the signal is not distorted. When the DQ of the current time node is at a high level, the DQ of the current time node may still be higher than the $V_{REF\_}1$ after being pulled up, since the $V_{REF\_}1$ is lower than the high level of the DQ. Therefore, the DQ may still be determined as the digital signal "1", and the signal is not distorted. Similarly, when the DQ of the previous time node is at a low level, in the sampling phase of DQ of the current time node, the first input circuit 403 is triggered to be turned off by the first feedback signal $F_{i-1}$, the second input circuit 404 is triggered to be turned on by the second feedback signal $F_{i-1}B$, and the $V_{REF\_}2$ is compared with the DQ on the current time. Then, when the DQ of the current time node is at a high level, the DQ of the current time node may not be lower than the $V_{REF\_}2$ after decreasing, since the $V_{REF\_}2$ is relatively low. Therefore, the DQ of the current time node may still be determined as the digital signal "1", and the signal is not distorted. When the DQ of the current time node is at a low level, the DQ of the current time node may still be lower than the $V_{REF\_2}$ after decreasing, since the $V_{REF\_2}$ is higher than the low level of the DQ. Therefore, the DQ may still be determined as the digital signal "0", and the signal is not distorted.

Correspondingly, when the comparator 40 employs a circuit solution that the $V_{REF\_1}$ is lower than the $V_{REF\_2}$, when the DQ of the previous time node is at a high level, in the sampling phase of the DQ of the current time node, the first input circuit 403 is triggered to be turned off by the first feedback signal $F_{i-1}$, the second input circuit 404 is triggered to be turned on by the second feedback signal $F_{i-1}B$, and the $V_{REF\_2}$ is compared with the DQ of the current time node. When the DQ of the previous time node is at a low level, in the sampling phase of the DQ of the current time node, the first input circuit 403 is triggered to be turned on by the first feedback signal $F_{i-1}$, the second input circuit 404 is triggered to be turned off by the second feedback signal $F_{i-1}B$, and the first reference signal $V_{REF\_1}$ is compared with the DQ of the current time node. Thus, it ensures that the DQ of the current time node is not distorted.

In the embodiment of the disclosure, the first cross-coupled circuit 405 and the second cross-coupled circuit 406 are both connected with a point A and a point B. In the sampling phase of the comparator 40, when the first input circuit 403 is turned on, at this time, the first cross-coupled circuit 405 will positively feed back the voltage at the point B (i.e., the first reference terminal voltage) according to the voltage at the point A (i.e., the first data terminal voltage), and meanwhile, it will positively feed back the voltage at the point A (i.e., the first data terminal voltage) according to the voltage at the point B (i.e., the first reference terminal voltage). Therefore, a change rate of the voltage at the point A and a change rate of the voltage at the point B can be accelerated in the sampling phase, the first differential signal can be obtained faster, and the time consumption in the sampling phase can be reduced. Correspondingly, in the sampling phase of the comparator 40, when the second input circuit 404 is turned on, at this time, the second cross-coupled circuit 406 will positively feed back the voltage at the point B (i.e., the second reference terminal voltage) according to the voltage at the point A (i.e., the second data terminal voltage), and meanwhile, it will positively feed back the voltage at the point A (i.e., the second data terminal voltage) according to the voltage at the point B (i.e., the second reference terminal voltage). Therefore, the change rate of the voltage at the point A and the change rate of the voltage at the point B can be accelerated in the sampling phase, the second differential signal can be obtained faster, and the time consumption in the sampling phase can be reduced.

It can be understood that, the comparator 40 in the embodiment of the disclosure may correspondingly adopt a more appropriate reference signal to be compared with the input signal of the current time node according to the input signal of the previous time node, to eliminate the problems caused by the ISI. Therefore, a comparison result is not affected by the ISI and it can ensure that the input signal is not distorted. Moreover, the voltage change rate of the comparator 40 in the sampling phase can be increased by using the first cross-coupled circuit 405 and the second cross-coupled circuit 406, the time consumption in the sampling phase can be reduced, and the operating rate can be improved.

Figure 5:
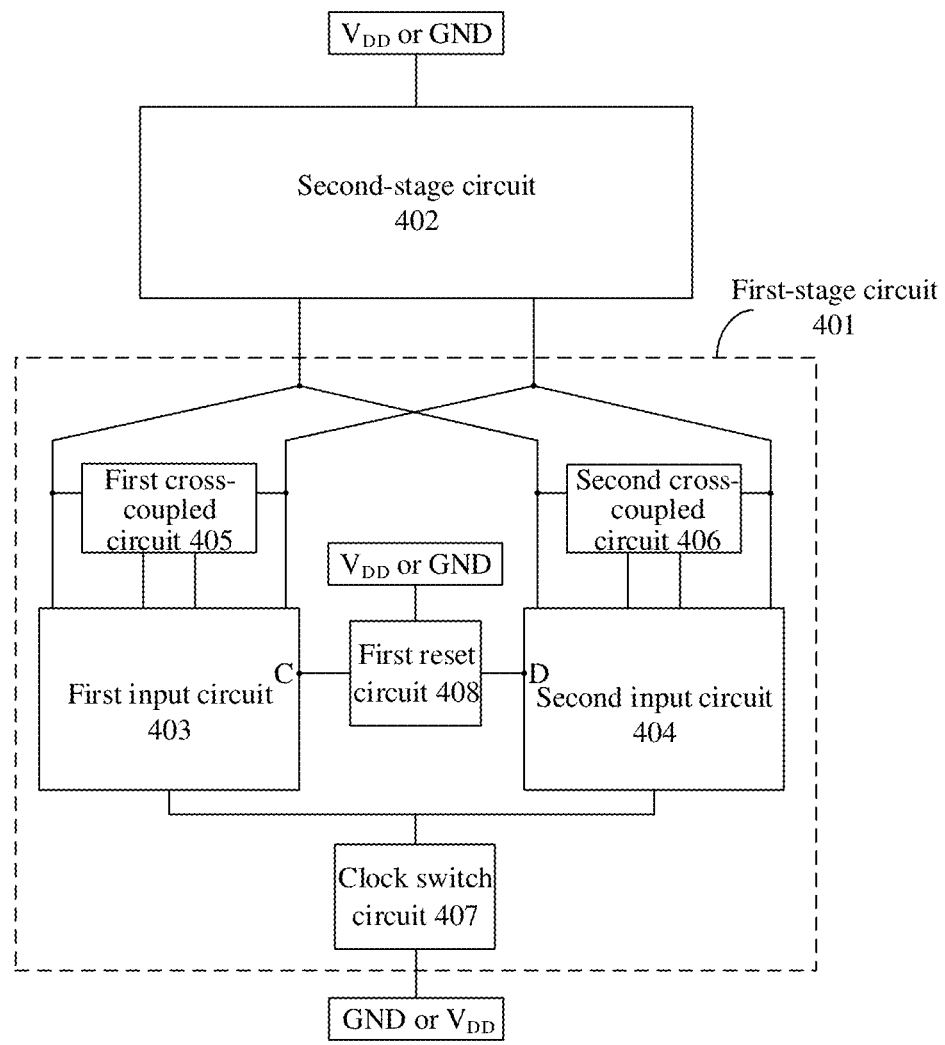
FIG. 5 is a second schematic diagram of a structure of a comparator provided in an embodiment of the disclosure.

In some embodiments of the disclosure, as illustrated in FIG. 5, in the comparator 40, a first-stage circuit 401 includes the first input circuit 403, the second input circuit 404, the first cross-coupled circuit 405 and the second cross-coupled circuit 406. In addition, the first-stage circuit 401 also includes a clock switch circuit 407 and a first reset circuit 408.

The first input circuit 403 and the second input circuit 404 are connected with each other through the first reset circuit 408. The first reset circuit 408 is also connected to the power supply terminal $V_{DD}$ or the ground terminal GND. The clock switch circuit 407 is connected with the first input circuit 403 and the second input circuit 404, and the clock switch circuit 407 is also connected to the ground terminal GND or the power supply terminal $V_{DD}$. The clock switch circuit 407 and the first reset circuit 408 both receive a clock signal. The clock switch circuit 407 is configured to control the comparator 40 to be turned on under the trigger of the clock signal, to enter the sampling phase. The first reset circuit 408 is configured to reset the first input circuit 403 and the second input circuit 404 in the resetting phase.

In the embodiment of the disclosure, under the trigger of the clock signal, the first reset circuit 408 may connect a connection point C of the first input circuit 403 and a connection point D of the second input circuit 404 with the power supply terminal $V_{DD}$ respectively in the resetting phase, so as to pull up the voltage of the connection point C and the voltage of the connection point D to a high level. Then, the first input circuit 403 and the second input circuit 404 are reset. Optionally, under the trigger of the clock signal, the first reset circuit 408 may connect the connection point C of the first input circuit 403 and the connection point D of the second input circuit 404 with the ground terminal respectively in the resetting phase, so as to decrease the voltage of the connection point C and the voltage of the connection point D to a low level. Then, the first input circuit 403 and the second input circuit 404 are reset.

In the embodiment of the disclosure, under the trigger of the clock signal, the clock switch circuit 407 may connect the first input circuit 403 and the second input circuit 404 with the ground terminal GND or the power supply terminal $V_{DD}$ respectively in the sampling phase, such that the comparator 40 is turned on and the operation of the comparator 40 is started.

It is to be noted that, as the electronic components used in the comparator 40 change, the ground terminal or the power supply terminal connected to the clock switch circuit 407 may change, and the power supply terminal or the ground terminal connected to the first reset circuit 408 may also change. When the comparator 40 adopts an electronic component solution, the clock switch circuit 407 may be connected to the ground terminal, and the first reset circuit 408 may be connected to the power supply terminal. When the comparator 40 adopts another electronic component solution, the clock switch circuit 407 may be connected to the power supply terminal, and the first reset circuit 408 may be connected to the ground terminal, which is not limited herein.

It can be understood that, the clock switch circuit 407 controls the comparator 40 to enter the sampling phase, to ensure the normal operation of the comparator 40. A local circuit of the comparator 40 is reset by using the first reset circuit 408, so that the comparator 40 can complete the resetting phase faster, and the operating rate of the comparator 40 can be improved.

Figure 6:
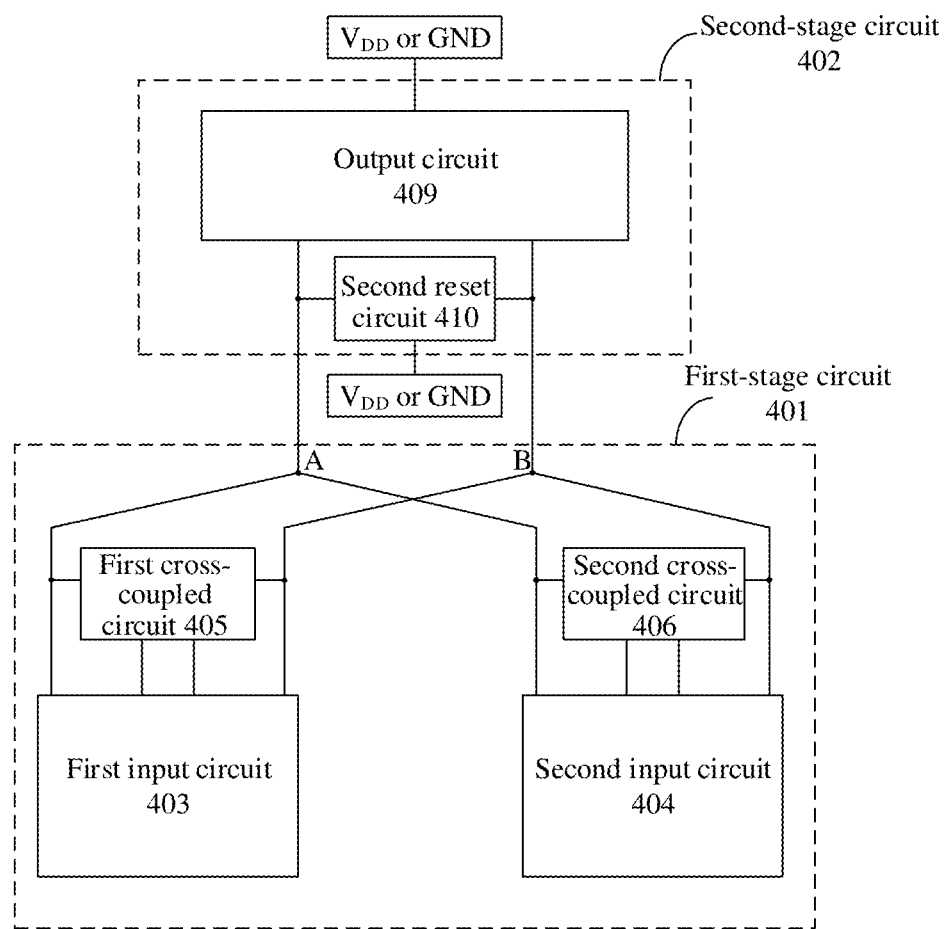
FIG. 6 is a third schematic diagram of a structure of a comparator provided in an embodiment of the disclosure.

In some embodiments of the disclosure, as illustrated in FIG. 6, the second-stage circuit 402 includes an output circuit 409 and a second reset circuit 410.

The second reset circuit 410 is connected with the output circuit 409. The output circuit 409 is also connected to the power supply terminal $V_{DD}$ or the ground terminal GND, and the second reset circuit 410 is also connected to the power supply terminal $V_{DD}$ or the ground terminal GND. The output circuit 409 is configured to amplify and latch the first differential signal or the second differential signal in the regeneration phase, to output a comparison signal. The second reset circuit 410 receives a clock signal, and the second reset circuit is configured to reset the output circuit 409 in the resetting phase according to the clock signal.

It is to be noted that, as different electronic components used in the comparator 40 change, the power supply terminal or the ground terminal connected to the output circuit 409 and the power supply terminal or the ground terminal connected to the second reset circuit 410 may also change. When the comparator 40 adopts an electronic component solution, the output circuit 409 and the second reset circuit 410 are both connected to the power supply terminal. When the comparator 40 adopts another electronic component solution, the output circuit 409 and the second reset circuit 410 are both connected to the ground terminal, which is not limited herein.

In the embodiment of the disclosure, under the trigger of the clock signal, the second reset circuit 410 may connect a connection point A and a connection point B of the output circuit 409 with the power supply terminal, respectively, so as to pull up the voltage of the connection point A and the voltage of the connection point B to a high level. Then, the output circuit 409 is reset. Optionally, under the trigger of the clock signal WCK, the second reset circuit 410 may connect the connection point A and the connection point B of the output circuit 409 with the ground terminal, respectively, so as to decrease the voltage of the connection point A and the voltage of the connection point B to a low level. Then, the output circuit 409 is reset.

It can be understood that, a partial circuit of the comparator 40 is reset by using the second reset circuit 410, so that the comparator 40 can complete the resetting phase faster, and the operating rate of the comparator 40 can be improved.

In some embodiments of the disclosure, the first cross-coupled circuit includes a first coupled transistor and a second coupled transistor. The first differential signal includes a first reference terminal output signal and a first data terminal output signal.

A first terminal of the first coupled transistor is connected with a control terminal of the second coupled transistor and connected with a first output terminal of the first input circuit. A control terminal of the first coupled transistor is connected with a first terminal of the second coupled transistor and connected with a second output terminal of the first input circuit. A second terminal of the first coupled transistor is connected with a second terminal of the second coupled transistor and connected with the first input circuit. The first coupled transistor and the second coupled transistor are NMOSs or PMOSs. The first coupled transistor is configured to perform positive feedback on the first data terminal voltage according to the first reference terminal voltage in the sampling phase, to obtain the first data terminal output signal. The second coupled transistor is configured to perform positive feedback on the first reference terminal voltage according to the first data terminal voltage in the sampling phase, to obtain the first reference terminal output signal.

Figure 7:
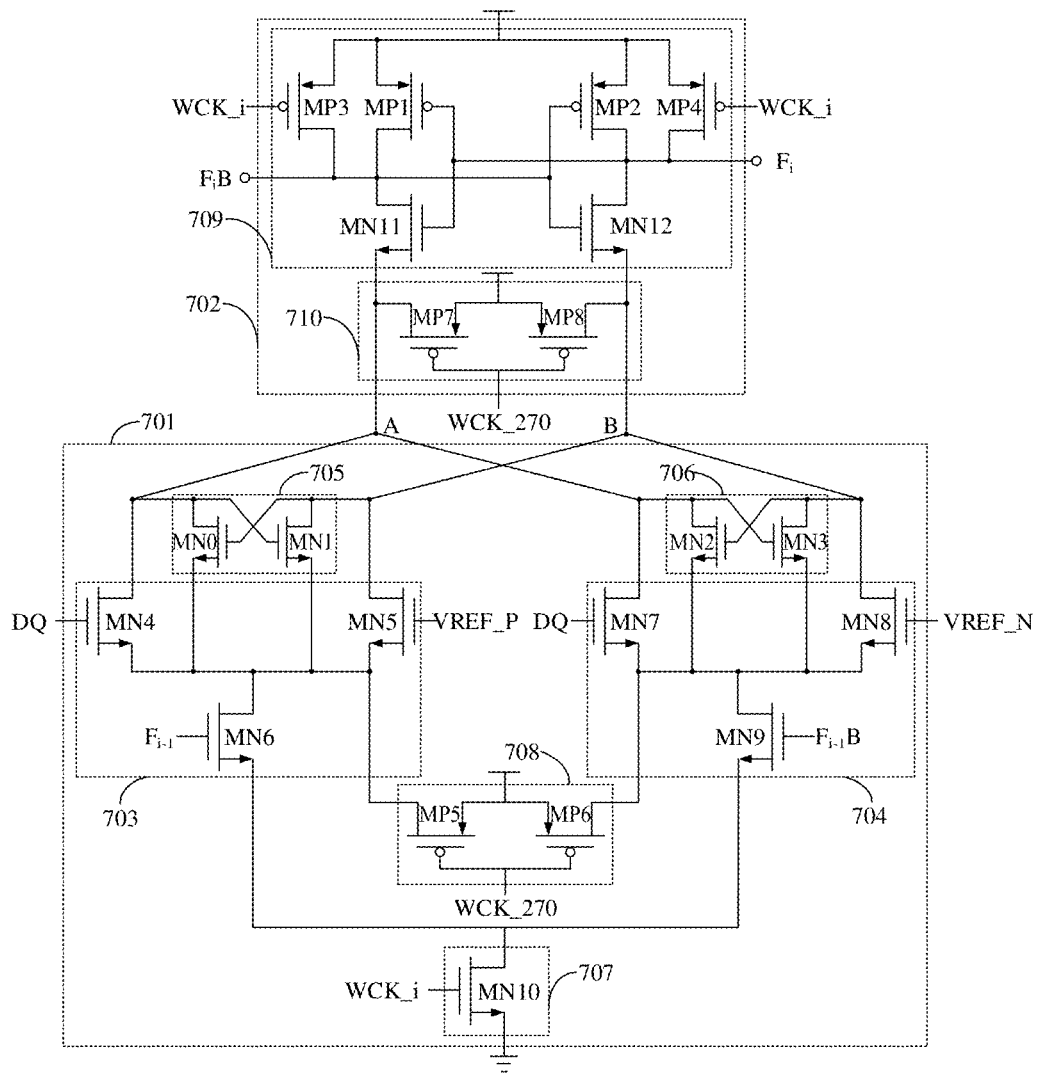
FIG. 7 is a fourth schematic diagram of a structure of a comparator provided in an embodiment of the disclosure.
Figure 8:
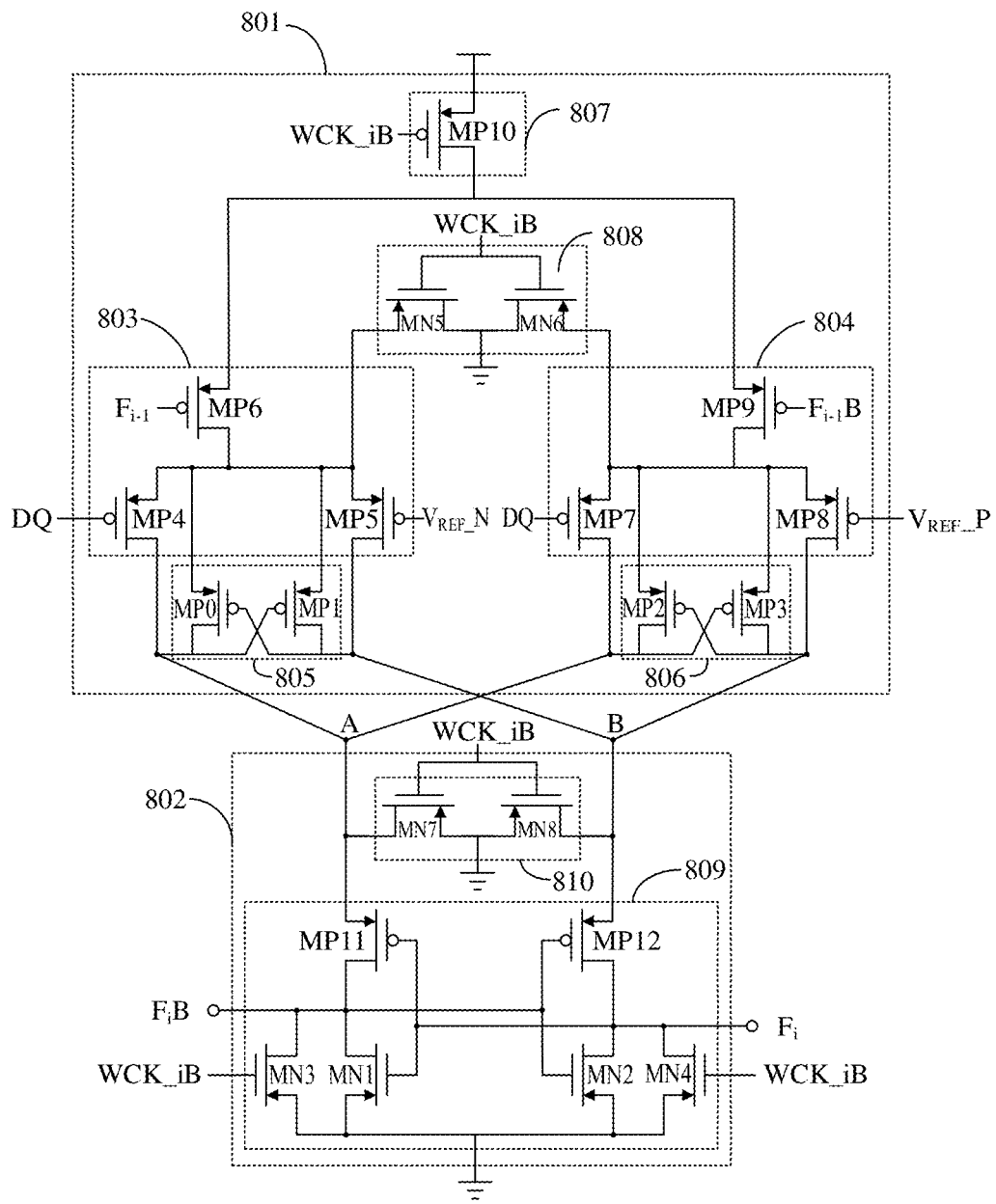
FIG. 8 is a fifth schematic diagram of a structure of a comparator provided in an embodiment of the disclosure.

In the embodiment of the disclosure, whether the NMOS or the PMOS is selected for the first coupled transistor and the second coupled transistor is determined by a circuit structure of the comparator. FIG. 7 and FIG. 8 respectively illustrate two different circuit structures of the comparator provided in the embodiments of the disclosure, the two different circuit structures are respectively described below in combination with FIG. 7 and FIG. 8.

As illustrated in FIG. 7, the first cross-coupled circuit 705 includes a first coupled transistor MN0 and a second coupled transistor MN1. The MN0 and the MN1 are NMOSs. A gate of the NMOS is a control terminal, a drain of the NMOS is a first terminal, and a source of the NMOS is a second terminal. A drain of the MN0 is connected with a gate of the MN1 and connected with a first output terminal (i.e., a point A) of the first input circuit 703. A gate of the MN0 is connected with a drain of the MN1 and connected with a second output terminal (i.e., a point B) of the first input circuit 703. A source of the MN0 is connected with a source of the MN1 and connected with the first input circuit 703. In the operating state, the MN0 performs positive feedback on its drain voltage (i.e., the first data terminal voltage) according to the change of its gate voltage (i.e., the first reference terminal voltage), so as to accelerate the change of its drain voltage, and finally to obtain its drain voltage (i.e., the first data terminal output signal) at the end of the sampling phase. The MN1 performs positive feedback on its drain voltage (i.e., the first reference terminal voltage) according to the change of its gate voltage (i.e., the first data terminal voltage), so as to accelerate the change of its drain voltage, and finally to obtain its drain voltage (i.e., the first reference terminal output signal) at the end of the sampling phase.

As illustrated in FIG. 8, the first cross-coupled circuit 805 includes a first coupled transistor MP0 and a second coupled transistor MP1. The MP0 and the MP1 are PMOSs. A gate of the PMOS is a control terminal, a drain of the PMOS is a first terminal, and a source of the PMOS is a second terminal. A drain of the MP0 is connected with a gate of the MP1 and connected with a first output terminal (i.e., a point A) of the first input circuit 803. A gate of the MP0 is connected with a drain of the MP1 and connected with a second output terminal (i.e., a point B) of the first input circuit 803. A source of the MP0 is connected with a source of the MP1 and connected with the first input circuit 803. In the operating state, the MP0 performs positive feedback on its drain voltage (i.e., the first data terminal voltage) according to the change of its gate voltage (i.e., the first reference terminal voltage), so as to accelerate the change of its drain voltage, and finally to obtain its drain voltage (i.e., the first data terminal output signal) at the end of the sampling phase. The MP1 performs positive feedback on its drain voltage (i.e., the first reference terminal voltage) according to the change of its gate voltage (i.e., the first data terminal voltage), so as to accelerate the change of its drain voltage, and finally to obtain its drain voltage (i.e., the first reference terminal output signal) at the end of the sampling phase.

In some embodiments of the disclosure, the second cross-coupled circuit includes a third coupled transistor and a fourth coupled transistor. The second differential signal includes a second reference terminal output signal and a second data terminal output signal.

A first terminal of the third coupled transistor is connected with a control terminal of the fourth coupled transistor and connected with a first output terminal of the second input circuit. A control terminal of the third coupled transistor is connected with a first terminal of the fourth coupled transistor and connected with a second output terminal of the second input circuit. A second terminal of the third coupled transistor is connected with a second terminal of the fourth coupled transistor and connected with the second input circuit. The third coupled transistor and the fourth coupled transistor are NMOSs or PMOSs. The third coupled transistor is configured to perform positive feedback on the second data terminal voltage according to the second reference terminal voltage in the sampling phase, to obtain the second data terminal output signal. The fourth coupled transistor is configured to perform positive feedback on the second reference terminal voltage according to the second data terminal voltage in the sampling phase, to obtain the second reference terminal output signal.

In the embodiment of the disclosure, whether the NMOS or the PMOS is selected for the fourth coupled transistor and the fourth coupled transistor is determined by the circuit structure of the comparator. FIG. 7 and FIG. 8 respectively illustrate two different circuit structures of the comparator provided in the embodiment of the disclosure, the two different circuit structures are respectively described below in combination with FIG. 7 and FIG. 8.

As illustrated in FIG. 7, the second cross-coupled circuit 706 includes a third coupled transistor MN2 and a fourth coupled transistor MN3. The MN2 and the MN3 are NMOSs. A gate of the NMOS is a control terminal, a drain of the NMOS is a first terminal, and a source of the NMOS is a second terminal. A drain of the MN2 is connected with a gate of the MN3 and connected with a first output terminal (i.e., a point A) of the second input circuit 704. A gate of the MN2 is connected with a drain of the MN3 and connected with a second output terminal (i.e., a point B) of the second input circuit 704. A source of the MN2 is connected with a source of the MN3 and connected with the second input circuit 704. In the operating state, the MN2 performs positive feedback on its drain voltage (i.e., the second data terminal voltage) according to the change of its gate voltage (i.e., the second reference terminal voltage), so as to accelerate the change of its drain voltage, and finally to obtain its drain voltage (i.e., the second data terminal output signal) at the end of the sampling phase. The MN3 performs positive feedback on its drain voltage (i.e., the second reference terminal voltage) according to the change of its gate voltage (i.e., the second data terminal voltage), so as to accelerate the change of its drain voltage, and to finally obtain its drain voltage (i.e., the second reference terminal output signal) at the end of the sampling phase.

As illustrated in FIG. 8, the second cross-coupled circuit 806 includes a third coupled transistor MP2 and a fourth coupled transistor MP3. The MP2 and the MP3 are PMOSs. A gate of the PMOS is a control terminal, a drain of the PMOS is a first terminal, and a source of the PMOS is a second terminal. A drain of the MP2 is connected with a gate of the MP3 and connected with a first output terminal (i.e., a point A) of the second input circuit 804. A gate of the MP2 is connected with a drain of the MP3 and connected with a second output terminal (i.e., a point B) of the second input circuit 804. A source of the MP2 is connected with a source of the MP3 and connected with the second input circuit 804. In the operating state, the MP2 performs positive feedback on its drain voltage (i.e., the second data terminal voltage) according to the change of its gate voltage (i.e., the second reference terminal voltage), so as to accelerate the change of its drain voltage, and finally to obtain its drain voltage (i.e., the second data terminal output signal) at the end of the sampling phase. The MP3 performs positive feedback on its drain voltage (i.e., the second reference terminal voltage) according to the change of its gate voltage (i.e., the second data terminal voltage), so as to accelerate the change of its drain voltage, and to finally obtain its drain voltage (i.e., the second reference terminal output signal) at the end of the sampling phase.

In some embodiments of the disclosure, the first input circuit includes a first input transistor, a second input transistor and a third input transistor.

A first terminal of the first input transistor and a first terminal of the second input transistor are respectively connected with the second-stage circuit. A second terminal of the third input transistor is connected to a ground terminal or a power supply terminal. A second terminal of the first input transistor and a second terminal of the second input transistor are both connected with the first terminal of the third input transistor. The first input transistor, the second input transistor and the third input transistor are all NMOSs or PMOSs. A control terminal of the first input transistor receives an input signal. A control terminal of the second input transistor receives a first reference signal. A control terminal of the third input transistor receives a first feedback signal. When the third input transistor is triggered to be turned on by the first feedback signal, the first input transistor generates the first data terminal voltage according to the input signal, and applies the first data terminal voltage to a control terminal of the second coupled transistor. The second input transistor generates a first reference terminal voltage according to the first reference signal, and applies the first reference terminal voltage a control terminal of the first coupled transistor.

In the embodiment of the disclosure, whether the NMOS or the PMOS is selected for the first input transistor, the second input transistor and the third input transistor is determined by the circuit structure of the comparator. FIG. 7 and FIG. 8 respectively illustrate two different circuit structures of the comparator provided in the embodiment of the disclosure, and the two different circuit structures are respectively described below in combination with FIG. 7 and FIG. 8.

As illustrated in FIG. 7, the comparator 70 includes a first input circuit 703. The first input circuit 703 includes a first input transistor MN4, a second input transistor MN5 and a third input transistor MN6. The MN4, the MN5 and the MN6 are all NMOSs. A gate of the NMOS is a control terminal, a drain of the NMOS is a first terminal, and a source of the NMOS is a second terminal. A drain of the MN4 is connected with the second-stage circuit 702 at the connection point A, and a drain of the MN5 is connected with the second-stage circuit 702 at the connection point B. A source of the MN6 is connected with a clock switch circuit 707. A source of the MN4 and a source of the MN5 are both connected with a drain of the MN6. A gate of the MN4 receives an input signal DQ. A gate of the MN5 receives a first reference signal $V_{REF\_}P$. A gate of the MN6 receives a first feedback signal $F_{i-1}$. In the operating state, when the clock signal WCK_i changes to a high level, that is, the comparator 70 enters the sampling phase, and when the first feedback signal $F_{i-1}$ is at a high level, the MN6 is triggered to be turned on by the $F_{i-1}$, and the first input circuit 703 is turned on. Further, the MN4 changes the voltage at the point A according to the received DQ to obtain the first data terminal voltage which is applied to a gate of the second coupled transistor MN1. The MN5 changes the voltage at the point B according to the received $V_{REF\_}P$ to obtain the first reference terminal voltage which is applied to a gate of the first coupled transistor MN0.

As illustrated in FIG. 8, the comparator 80 includes a first input circuit 803. The first input circuit 803 includes a first input transistor MP4, a second input transistor MP5 and a third input transistor MP6. The MP4, the MP5 and the MP6 are all PMOSs. A gate of the PMOS is a control terminal, a drain of the PMOS is a first terminal, and a source of the PMOS is a second terminal. A drain of the MP4 is connected with the second-stage circuit 802 at the connection point A, and a drain of the MP5 is connected with the second-stage circuit 802 at the connection point B. A source of the MP6 is connected with a clock switch circuit 807. A source of the MP4 and a source of the MP5 are both connected with a drain of the MP6. A gate of the MP4 receives an input signal DQ. A gate of the MP5 receives a first reference signal $V_{REF\_N}$. A gate of the MP6 receives a first feedback signal $F_{i-1}$. In the operating state, when a clock signal WCK_iB changes to a low level, that is, the comparator 80 enters the sampling phase, and when the first feedback signal $F_{i-1}$ is at a low level, the MP6 is triggered to be turned on by the $F_{i-1}$, and the first input circuit 803 is turned on. Further, the MP4 changes the voltage at the point A according to the received DQ to obtain the first data terminal voltage which is applied to a gate of the second coupled transistor MP1. The MP5 changes the voltage at the point B according to the received $V_{REF\_N}$ to obtain the first reference terminal voltage which is applied to a gate of the first coupled transistor MP0.

It is to be noted that, the $V_{REF\_P}$ and the $V_{REF\_N}$ are used for representing the relationship of sizes between two reference signals, in which the $V_{REF\_P}$ is higher than the $V_{REF\_N}$. In the comparator 70 illustrated in FIG. 7, since the first reference signal is higher than the second reference signal, the first reference signal is represented as $V_{REF\_P}$, and the second reference signal is represented as $V_{REF\_N}$. In the comparator 80 illustrated in FIG. 8, since the first reference signal is lower than the second reference signal, the first reference signal is represented as $V_{REF\_N}$, and the second reference signal is represented as $V_{REF\_P}$.

In some embodiments of the disclosure, the second input circuit includes a fourth input transistor, a fifth input transistor and a sixth input transistor.

A first terminal of the fourth input transistor and a first terminal of the fifth input transistor are respectively connected with the second-stage circuit. A second terminal of the fourth input transistor and a second terminal of the fifth input transistor are both connected with a first terminal of the sixth input transistor. The fourth input transistor, the fifth input transistor and the sixth input transistor are all NMOSs or PMOSs. A control terminal of the fourth input transistor receives an input signal. A control terminal of the fifth input transistor receives a second reference signal. A control terminal of the sixth input transistor receives a second feedback signal. When the sixth input transistor is triggered to be turned on by the second feedback signal, the fourth input transistor generates the second data terminal voltage according to the input signal, and the second data terminal voltage is applied to a control terminal of the fourth coupled transistor. The fifth input transistor generates a second reference terminal voltage according to the second reference signal, and the second reference terminal voltage is applied to a control terminal of the third coupled transistor.

In the embodiment of the disclosure, whether the NMOS or the PMOS is selected for the fourth input transistor, the fifth input transistor and the sixth input transistor is determined by the circuit structure of the comparator. FIG. 7 and FIG. 8 respectively illustrate two different circuit structures of the comparator provided in the embodiment of the disclosure, and the two different circuit structures are respectively described below in combination with FIG. 7 and FIG. 8.

As illustrated in FIG. 7, the comparator 70 includes a second input circuit 704. The second input circuit 704 includes a fourth input transistor MN7, a fifth input transistor MN8 and a sixth input transistor MN9. The MN7, the MN8 and the MN9 are all NMOSs. A gate of the NMOS is a control terminal, a drain of the NMOS is a first terminal, and a source of the NMOS is a second terminal. A drain of the MN7 is connected with the second-stage circuit 702 at the connection point A, and a drain of the MN8 is connected with the second-stage circuit 702 at the connection point B. A source of the MN9 is connected with a clock switch circuit 707. A source of the MN7 and a source of the MN8 are connected with a drain of the MN9. A gate of the MN7 receives an input signal DQ. A gate of the MN8 receives a second reference signal $V_{REF\_N}$. A gate of the MN9 receives a second feedback signal $F_{i-1}B$, and the second feedback signal $F_{i-1}B$ and the first feedback signal $F_{i-1}$ are signals inverted from each other. In the operating state, when a clock signal WCK_i changes to a high level, that is, the comparator 70 enters the sampling phase, and when the first feedback signal $F_{i-1}$ is at a low level, the second feedback signal $F_{i-1}B$ is at a high level, the MN9 is triggered to be turned on by the $F_{i-1}B$, and the second input circuit 704 is turned on. Further, the MN7 changes the voltage at the point A according to the received DQ to obtain the second data terminal voltage which is applied to a gate of the fourth coupled transistor MN3. The MN8 changes the voltage at the point B according to the received $V_{REF\_N}$ to obtain the second reference terminal voltage which is applied to a gate of the third coupled transistor MN2.

As illustrated in FIG. 8, the comparator 80 includes a second input circuit 804. The second input circuit 804 includes a fourth input transistor MP7, a fifth input transistor MP8 and a sixth input transistor MP9. The MP7, the MP8 and the MP9 are all PMOSs. A gate of the PMOS is a control terminal, a drain of the PMOS is a first terminal, and a source of the PMOS is a second terminal.

A drain of the MP7 is connected with the second-stage circuit 802 at a connection point A, and a drain of the MP8 is connected with the second-stage circuit 802 at a connection point B. A source of the MP9 is connected with a clock switch circuit 807. A source of the MP7 and a source of the MP8 are both connected with a drain of the MP9. A gate of the MP7 receives an input signal DQ. A gate of the MP8 receives a second reference signal $V_{REF\_P}$. A gate of the MP9 receives a second feedback signal $F_{i-1}B$, and the second feedback signal $F_{i-1}B$ and the first feedback signal $F_{i-1}$ are signals inverted from each other. In the operating state, when a clock signal WCK_iB changes to a low level, that is, the comparator 80 enters the sampling phase, and when the first feedback signal $F_{i-1}$ is at a high level, the second feedback signal $F_{i-1}B$ is at a low level, the MP9 is triggered to be turned on by the $F_{i-1}B$, and the second input circuit 804 is turned on. Further, the MP7 changes the voltage at the point A according to the received DQ to obtain the second data terminal voltage which is applied to a gate of the fourth coupled transistor MP3. The MP8 changes the voltage at the point B according to the received $V_{REF\_P}$ to obtain the second reference terminal voltage which is applied to a gate of the third coupled transistor MP2.

It is to be noted that, the $V_{REF\_P}$ and the $V_{REF\_N}$ are used for representing the relationship of sizes between two reference signals, in which the $V_{REF\_P}$ is higher than the $V_{REF\_N}$. In the comparator 70 illustrated in FIG. 7, since the first reference signal is higher than the second reference signal, the first reference signal is represented as $V_{REF\_P}$, and the second reference signal is represented as $V_{REF\_N}$. In the comparator 80 illustrated in FIG. 8, since the first reference signal is lower than the second reference signal, the first reference signal is represented as $V_{REF\_N}$, and the second reference signal is represented as $V_{REF\_P}$.

In some embodiments of the disclosure, the first reset circuit includes a first reset transistor and a second reset transistor.

A first terminal of the first reset transistor and a first terminal of the second reset transistor are both connected to a power supply terminal or a ground terminal. A second terminal of the first reset transistor is connected with the first input circuit. A second terminal of the second reset transistor is connected with the second input circuit. The first reset transistor and the second reset transistor are PMOSs or NMOSs. A control terminal of the first reset transistor and a control terminal of the second reset transistor both receive a clock signal. When the first reset transistor and the second reset transistor are triggered to be turned on by the clock signal, the first input circuit is connected to the power supply terminal or the ground terminal through the first reset transistor, to reset the first input circuit, and the second input circuit is connected to the power supply terminal or the ground terminal through the second reset transistor, to reset the first input circuit.

In the embodiment of the disclosure, whether the PMOS or the NMOS is selected for the first reset transistor and the second reset transistor is determined by the circuit structure of the comparator. FIG. 7 and FIG. 8 respectively illustrate two different circuit structures of the comparator provided in the embodiment of the disclosure, the two different circuit structures are respectively described below in combination with FIG. 7 and FIG. 8.

As illustrated in FIG. 7, the comparator 70 includes a first reset circuit 708. The first reset circuit 708 includes a first reset transistor MP5 and a second reset transistor MP6. The MP5 and the MP6 are PMOSs. A gate of the PMOS is a control terminal, a source of the PMOS is a first terminal, and a drain of the PMOS is a second terminal. A source of the MP5 and a source of the MP6 are both connected to the power supply terminal. A drain of the MP5 is connected with the first input circuit 703, and a drain of the MP6 is connected with the second input circuit 704. A gate of the MP5 and a gate of the MP6 both receive a clock signal WCK_i. In the operating state, when the clock signal WCK_i changes to a low level, that is, the comparator 70 enters the resetting phase, the MP5 and the MP6 are triggered to be turned on by the WCK_i. The first input circuit 703 and the second input circuit 704 are connected to the power supply terminal through the MP5 and the MP6, respectively, thus, the voltage at the connection point of the first input circuit and the voltage at the connection point of the second input circuit are pulled up to the high level. Therefore, the first input circuit 703 and the second input circuit 704 are reset.

As illustrated in FIG. 8, the comparator 80 includes a first reset circuit 808. The first reset circuit 808 includes a first reset transistor MN5 and a second reset transistor MN6. The MN5 and the MN6 are NMOSs. A gate of the NMOS is a control terminal, a drain of the NMOS is a first terminal, and a source of the NMOS is a second terminal. A drain of the MN5 and a drain of the MN6 are both connected to the ground terminal. A source of the MN5 is connected with the first input circuit 803, and a source of the MN6 is connected with the second input circuit 804. A gate of the MN5 and a gate of the MN6 both receive a clock signal WCK_iB. In the operating state, when the clock signal WCK_iB changes to a high level, that is, the comparator 80 enters the resetting phase, the MN5 and the MN6 are triggered to be turned on by the WCK_iB. The first input circuit 803 and the second input circuit 804 are connected to the ground terminal respectively through the MN5 and the MN6, thus, the voltage at the connection point of the first input circuit and the voltage at the connection point of the second input circuit decrease to the low level. Therefore, the first input circuit 803 and the second input circuit 804 are reset.

In some embodiments of the disclosure, the clock switch circuit includes a clock switch transistor.

A first terminal of the clock switch transistor is connected with a first input circuit and a second input circuit. A second terminal of the clock switch transistor is connected to a ground terminal or a power supply terminal. The clock switch transistor is an NMOS or a PMOS. A control terminal of the clock switch transistor receives a clock signal. When the clock switch transistor is triggered to be turned on by the clock signal, the first input circuit and the second input circuit are both connected to the ground terminal or the power supply terminal through the clock switch transistor, to turn on the comparator.

In the embodiment of the disclosure, whether the NMOS or the PMOS is selected for the clock switch transistor is determined by the circuit structure of the comparator. FIG. 7 and FIG. 8 respectively illustrate two different circuit structures of the comparator provided in the embodiment of the disclosure, the two different circuit structures are respectively described below in combination with FIG. 7 and FIG. 8.

As illustrated in FIG. 7, the comparator 70 includes a clock switch circuit 707. The clock switch circuit 707 includes a clock switch transistor MN10. The MN10 is an NMOS. A gate of the NMOS is a control terminal, a drain of the NMOS is a first terminal, and a source of the NMOS is a second terminal. A drain of the MN10 is connected with the first input circuit 703 and the second input circuit 704. A source of the MN10 is connected to the ground terminal. A gate of the MN10 receives a clock signal WCK_i. In the operating state, when the WCK_i changes to a high level, the MN10 is triggered to be turned on by the WCK_i, the first input circuit 703 and the second input circuit 704 are connected to the ground terminal through the MN10, and the comparator 70 is turned on to enter the sampling phase.

As illustrated in FIG. 8, the comparator 80 includes a clock switch circuit 807. The clock switch circuit 807 includes a clock switch transistor MP10. The MP10 is a PMOS. A gate of the PMOS is a control terminal, a drain of the PMOS is a first terminal, and a source of the PMOS is a second terminal. A drain of the MP10 is connected with the first input circuit 803 and the second input circuit 804. A source of the MP10 is connected to the power supply terminal. A gate of the MP10 receives a clock signal WCK_iB. In the operating state, when the WCK_iB changes to a low level, the MP10 is triggered to be turned on by the WCK_iB, the first input circuit 803 and the second input circuit 804 are connected to the power supply terminal through the MP10, and the comparator 80 is turned on to enter the sampling phase.

In some embodiments of the disclosure, the second reset circuit includes a third reset transistor and a fourth reset transistor.

A first terminal of the third reset transistor and a first terminal of the fourth reset transistor are both connected to a power supply terminal or a ground terminal. A second terminal of the third reset transistor and a second terminal of the fourth reset transistor are respectively connected with the output circuit. The third reset transistor and the fourth reset transistor are PMOSs or NMOSs. A control terminal of the third reset transistor and a control terminal of the fourth reset transistor both receive a clock signal. When the third reset transistor and the fourth reset transistor are triggered to be turned on by the clock signal, the output circuit is connected to the power supply terminal or the ground terminal through the third reset transistor and the fourth reset transistor, to reset the output circuit.

In the embodiment of the disclosure, whether the PMOS or the NMOS is selected for the third reset transistor and the fourth reset transistor is determined by the circuit structure of the comparator. FIG. 7 and FIG. 8 respectively illustrate two different circuit structures of the comparator provided in the embodiment of the disclosure, the two different circuit structures are respectively described below in combination with FIG. 7 and FIG. 8.

As illustrated in FIG. 7, the comparator 70 includes a second reset circuit 710. The second reset circuit 710 includes a third reset transistor MP7 and a fourth reset transistor MP8. The MP7 and the MP8 are PMOSs. A gate of the PMOS is a control terminal, a source of the PMOS is a first terminal, and a drain of the PMOS is a second terminal. A source of the MP7 and a source of the MP8 are both connected to the power supply terminal. A drain of the MP7 is connected to the output circuit through a connection point A, and a drain of the MP8 is connected to the output circuit through a connection point B. A gate of the MP7 and a gate of the MP8 both receive a clock signal WCK_i. In the operating state, when the clock signal WCK_i changes to a low level, that is, the comparator 70 enters the resetting phase, the MP7 and the MP8 are triggered to be turned on by the WCK_i. The output circuit 709 is connected to the power supply terminal respectively through the connection point A and the connection point B, thus the voltage of the connection point A and the voltage of the connection point B are pulled up to the high level. Therefore, the output circuit 709 is reset.

As illustrated in FIG. 8, the comparator 80 includes a second reset circuit 810. The second reset circuit 810 includes a third reset transistor MN7 and a fourth reset transistor MN8. The MN7 and the MN8 are NMOSs. A gate of the NMOS is a control terminal, a source of the NMOS is a first terminal, and a drain of the NMOS is a second terminal. A source of the MN7 and a source of the MN8 are both connected to the ground terminal. A drain of the MN7 is connected with the output circuit through a connection point A, and a drain of the MN8 is connected with the output circuit through a connection point B. A gate of the MN7 and a gate of the MN8 both receive a clock signal WCK_iB. In the operating state, when the clock signal WCK_iB changes to a high level, that is, the comparator 80 enters the resetting phase, the MN7 and the MN8 are triggered to be turned on by the WCK_iB. The output circuit 809 is connected to the ground terminal respectively through the connection point A and the connection point B, thus the voltage of the connection point A and the voltage of the connection point B decrease to the low level. Therefore, the output circuit 809 is reset.

In some embodiments of the disclosure, the output circuit includes a first output transistor, a second output transistor, a third output transistor, a fourth output transistor, a fifth output transistor and a sixth output transistor.

A control terminal of the first output transistor, a first terminal of the second output transistor, a control terminal of the third output transistor, a second terminal of the fourth output transistor and a second terminal of the sixth output transistor are all connected with a first output terminal of the output circuit. A first terminal of the first output transistor, a control terminal of the second output transistor, a second terminal of the third output transistor, a control terminal of the fourth output transistor and a second terminal of the fifth output transistor are all connected with the second output terminal of the output circuit. A second terminal of the first output transistor is connected with the first input circuit, the second input circuit and the second reset circuit. A second terminal of the second output transistor is connected with the first input circuit, the second input circuit and the second reset circuit. A first terminal of the third output transistor, a first terminal of the fourth output transistor, a first terminal of the fifth output transistor and a first terminal of the sixth output transistor are connected to a power supply terminal or a ground terminal. The first output transistor and the second output transistor are NMOSs or PMOSs. The third transistor, the fourth output transistor, the fifth output transistor and the sixth output transistor are all PMOSs or NMOSs. A control terminal of the fifth output transistor and a control terminal of the sixth output transistor receive a clock signal.

In the embodiment of the disclosure, whether the NMOS or the PMOS is selected for the first output transistor and the second output transistor, and whether the PMOS or the NMOS is selected for the third output transistor, the fourth output transistor, the fifth output transistor and the sixth output transistor are determined by the circuit structure of the comparator. FIG. 7 and FIG. 8 respectively illustrate two different circuit structures of the comparator provided in the embodiment of the disclosure, the two different circuit structures are respectively described below in combination with FIG. 7 and FIG. 8.

As illustrated in FIG. 7, the comparator 70 includes an output circuit 709. The output circuit 709 includes a first output transistor MN11, a second output transistor MN12, a third output transistor MP1, a fourth output transistor MP2, a fifth output transistor MP3 and a sixth output transistor MP4. The MN11 and the MN12 are NMOSs. A gate of the NMOS is a control terminal, a drain of the NMOS is a first terminal, and a source of the NMOS is a second terminal. The MP1, the MP2, the MP3 and the MP4 are all PMOSs. A gate of the PMOS is a control terminal, a source of the PMOS is a first terminal, and a drain of the PMOS is a second terminal. A gate of the MN11, a drain of the MN12, a gate of the MP1, a drain of the MP2 and a drain of the MP4 are all connected with the first output terminal of the output circuit 709. The first output terminal of the output circuit 709 outputs the $F_i$ signal in the comparison signal. A drain of the MN11, a gate of the MN12, a drain of the MP1, a gate of the MP2 and a drain of the MP3 are all connected with the second output terminal of the output circuit 709. The second output terminal of the output circuit 709 outputs the $F_iB$ signal in the comparison signal. The $F_iB$ is an inverted signal of the $F_i$. A source of the MN11 is connected with the first input circuit 703, the second input circuit 704 and the second reset circuit 710 through the connection point A. A source of the MN12 is connected with the first input circuit 703, the second input circuit 704 and the second reset circuit 710 through the connection point B. A source of the MP1, a source of the MP2, a source of the MP3 and a source of the MP4 are all connected to the power supply terminal. A gate of the MP3 and a gate of the MP4 receive a clock signal WCK_i.

When the clock signal WCK_i is at a low level, that is, in the resetting phase of the comparator 70, the MP3 and the MP4 are triggered to be turned on by the WCK_i. At this time, the voltage of the first output terminal and the voltage of the second output terminal keep at a high level. When the clock signal WCK_i changes to a high level, that is, at the beginning of the sampling phase of the comparator 70, the MP3 and the MP4 are triggered to be turned off by the WCK_i. At this time, the output circuit 709 receives the first differential signal or the second differential signal. The voltage of the first output terminal and the voltage of the second output terminal are affected by the first differential signal or the second differential signal, then begin to gradually decrease to the low level until the MP1 and the MP2 are triggered to be turned on. Then, the sampling phase of the comparator 70 ends, and the regeneration phase begins. At the beginning of the regeneration phase of the comparator 70, the cross-coupled inverter composed of the MP1 and the MP2 amplifies the voltage difference between the first output terminal and the second output terminal formed in the sampling phase through positive feedback, until the voltage difference is amplified to a sufficient extent. Then, the output circuit 709 latches the voltage of the first output terminal and the voltage of the second output terminal, and outputs the latched level as a comparison signal, that is, $F_i$ and $F_iB$ are output.

As illustrated in FIG. 8, the comparator 80 includes an output circuit 809. The output circuit 809 includes a first output transistor MP11, a second output transistor MP12, a third output transistor MN1, a fourth output transistor MN2, a fifth output transistor MN3 and a sixth output transistor MN4. The MP11 and the MP12 are PMOSs. A gate of the PMOS is a control terminal, a drain of the PMOS is a first terminal, and a source of the PMOS is a second terminal. The MN1, the MN2, the MN3 and the MN4 are all NMOSs. A gate of the NMOS is a control terminal, a source of the NMOS is a first terminal, and a drain of the NMOS is a second terminal. A gate of the MP11, a drain of the MP12, a gate of the MN1, a drain of the MN2 and a drain of the MN4 are all connected with the first output terminal of the output circuit 809, and a first output terminal of the output circuit 809 outputs the $F_i$ signal in the comparison signal. A drain of the MP11, a gate of the MP12, a drain of the MN1, a gate of the MN2 and a drain of the MN3 are all connected with the second output terminal of the output circuit 809, and a second output terminal of the output circuit 809 outputs the $F_iB$ signal in the comparison signal. The $F_iB$ is an inverted signal of the $F_i$. A source of the MP11 is connected with the first input circuit 803, the second input circuit 804 and the second reset circuit 810 through the connection point A. A source of the MP12 is connected with the first input circuit 803, the second input circuit 804 and the second reset circuit 810 through the connection point B. A source of the MN1, a source of the MN2, a source of the MN3 and a source of the MN4 are all connected to the ground terminal. A gate of the MN3 and a gate of the MN4 receive a clock signal WCK_iB.

When the clock signal WCK_iB is at a high level, that is, in the resetting phase of the comparator 80, the MN3 and the MN4 are triggered to be turned on by the WCK_iB. At this time, the voltage of the first output terminal and the voltage of the second output terminal keep at a low level. When the clock signal WCK_iB changes to a low level, that is, at the beginning of the sampling phase of the comparator 80, the MN3 and the MN4 are triggered to be turned on by the WCK_iB. At this time, the output circuit 809 receives the first differential signal or the second differential signal. The voltage of the first output terminal and the voltage of the second output terminal are affected by the first differential signal or the second differential signal, then begin to be gradually pulled up to the high level, until the MN1 and the MN2 are triggered to be turned on. Then, the sampling phase of the comparator 80 ends, and the regeneration phase begins. At the beginning of the regeneration phase of the comparator 80, the cross-coupled inverter composed of the MN1 and the MN2 amplifies the voltage difference between the first output terminal and the second output terminal formed in the sampling phase through positive feedback, until the voltage difference is amplified to a sufficient extent. Then, the output circuit 809 latches the voltage of the first output terminal and the voltage of the second output terminal, and outputs the latched level as a comparison signal, that is, $F_i$ and $F_iB$ are output.

Figure 9:
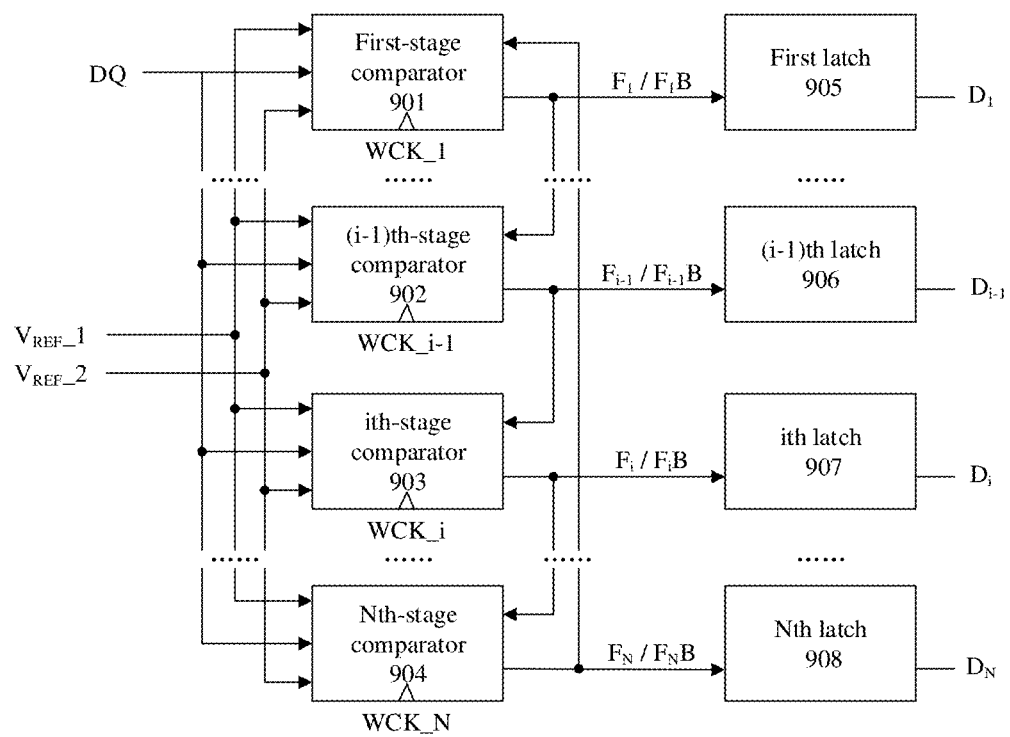
FIG. 9 is a first schematic diagram of a structure of a DFE circuit provided in an embodiment of the disclosure.

FIG. 9 is a schematic diagram of a structure of a DFE circuit provided in an embodiment of the disclosure. As illustrated in FIG. 9, the DFE circuit 90 includes N stages of comparators described in the above embodiment. N is a positive integer greater than 1.

A first input terminal of a comparator at each stage receives an input signal DQ. A second input terminal of the comparator at each stage receives a first reference signal $V_{REF\_}1$. A third input terminal of the comparator at each stage receives a second reference signal $V_{REF\_}2$.

A fourth input terminal of a first-stage comparator 901 is connected with an output terminal of an Nth-stage comparator 904 to receive an Nth-stage comparison signal $F_N/F_NB$ output by the Nth-stage comparator 904. A fifth input terminal of the first-stage comparator 901 receives a first clock signal WCK_1.

A fourth input terminal of an ith-stage comparator 903 is connected with an output terminal of an (i−1)th-stage comparator 902 to receive an (i−1)th-stage comparison signal $F_{i-1}/F_{i-1}B$ output by the (i−1)th-stage comparator 902. A fifth input terminal of the (i−1)th-stage comparator 903 receives an ith clock signal WCK_i, where i is greater than 1 and less than or equal to N.

Under trigger of a clock signal at each stage, the comparator at each stage compares the input signal DQ with the first reference signal $V_{REF\_}1$ or compares the input signal DQ with the second reference signal $V_{REF\_}2$, according to a comparison signal corresponding to a fourth input terminal of the comparator at each stage, to output a comparison signal at each stage.

In the embodiment of the disclosure, the comparator at each stage in the DFE circuit 90 has five input terminals and one output terminal. The five input terminals of the comparator at each stage respectively receive the input signal DQ, the first reference signal $V_{REF\_}1$, the second reference signal $V_{REF\_}2$, the previous-stage comparison signal (the first-stage comparator receives the Nth-stage comparison signal) and the clock signal corresponding to the comparator at each stage. The output terminal of the comparator at each stage outputs the comparison signal at each stage.

In the embodiment of the disclosure, the comparison signal at each stage includes two mutually inverted signals, which are respectively used as the first feedback signal and the second feedback signal in the above embodiments, to be input into the next-stage comparator (the first-stage comparator receives the Nth-stage comparison signal). For example, $F_{i-1}$ and are signals inverted from each other, $F_{i-1}$ is input to the ith-stage comparator as the first feedback signal, and $F_{i-1}B$ is input to the ith-stage comparator as the second feedback signal. In this way, the next-stage comparator may be controlled to select the first reference signal $V_{REF\_}1$ or the second reference signal $V_{REF\_}2$ in the sampling phase according to the output result of the comparator at each stage.

In the embodiment of the disclosure, a phase of an ith clock signal WCK_i is 360°/N later than a phase of an (i−1)th clock signal WCK_i−1, that is, the phase of the clock signal corresponding to the comparator at each stage is later than the phase of the clock signal corresponding to the previous-stage comparator by one Nth of the clock cycle. In this way, the phase of a first clock signal WCK_1 is also later than that of a Nth clock signal WCK_N by one Nth of the clock cycle. Therefore, the phase delay between various clock signals will result in the comparators of all stages entering the sampling phase at various time nodes in sequence caused by the fact that the comparator is controlled by the clock signal to enter the sampling phase. In other words, the comparators of all stages sequentially sample the level of the input signals DQ of respective time nodes in a clock cycle and output the comparison signals of all stages. An interval between two adjacent time nodes is one Nth of the clock cycle, that is, the comparators at all stages in the DFE circuit 90 sequentially obtain the symbol of the input signal DQ.

For example, the (i−1)th-stage comparator 902 is controlled by an (i−1)th clock signal WCK_i−1 to enter the sampling phase at an (i−1)th time node, and to sample the level of the input signal DQ of the (i−1)th time node, further, the (i−1)th-stage comparator outputs an (i−1)th-stage comparison signal $F_{i-1}/F_{i-1}B$. Then, the ith-stage comparator 903 is controlled by an ith clock signal WCK_i to enter the sampling phase at the ith time node which is one Nth of clock cycle later than the (i−1)th time node, to sample the level of the input signal DQ of the ith time node and to output an ith-stage comparison signal $F_i/F_iB$. By such analogy, the Nth-stage comparator 904 is controlled by an Nth clock signal WCK_N to enter the sampling phase at the Nth time node, to sample the level of the input signal DQ of the Nth time node and to output an Nth stage comparison signal. After the Nth time node is passed by, a next clock cycle is started, and the first-stage comparator enters the sampling phase again to sample the level of the input signal at the (N+1)th time node which is one Nth of clock cycle later than the Nth time node.

The previous-stage comparison signal received by the comparator at each stage reflects the level of the input signal DQ of the previous time node. The ith-stage comparator is taken as an example, the ith-stage comparator samples the DQ at the ith time node, and the $F_{i-1}/F_{i-1}B$ signal received by the ith-stage comparator reflects the level of the DQ of the (i−1)th time node. Due to the ISI, the level of the DQ of the ith time node may be interfered by the level of the DQ of the (i−1)th time node. However, the ith-stage comparator may take the received $F_{i-1}/F_{i-1}B$ signal as the first feedback signal and the second feedback signal, to select an appropriate reference signal from the two reference signals according to the $F_{i-1}/F_{i-1}B$ signal, in order to compare the selected reference signal with the level of the DQ of the ith time node. That is, the reference signal with a higher level is selected for comparison when the level of the DQ of the (i−1)th time node is high, and the reference signal with a lower level is selected for comparison when the level of the DQ of the (i−1)th time node is low, so as to eliminate the influence of ISI.

It is to be noted that, when the DFE circuit 90 adopts the comparator in the above embodiments, the DFE needs to be adjusted according to the adopted circuit structure of the comparator. When the DFE circuit 90 adopts the comparator 70 illustrated in FIG. 7 as the ith-stage comparator, the first reference signal $V_{REF\_}1$ may be set as the reference signal $V_{REF\_}P$ with a relatively high level, the second reference signal $V_{REF\_}2$ may be set as the reference signal $V_{REF\_}N$ with a relatively low level, and a clock signal WCK_i is input. When the DFE circuit 90 adopts the comparator 80 illustrated in FIG. 8 as the ith-stage comparator, in order to achieve the same effect as the comparator 70, the first reference signal $V_{REF\_}1$ needs to be set as the reference signal $V_{REF\_}N$ with a relatively low level, the second reference signal $V_{REF\_}2$ needs to be set as the reference signal $V_{REF\_}P$ with a relatively high level, and a clock signal WCK_iB inverted from the WCK_i is input. That is, the comparator 70 illustrated in FIG. 7 and the comparator 80 illustrated in FIG. 8 may be equivalently replaced with each other in the DFE circuit 90.

It can be understood that, the DFE circuit 90 illustrated in FIG. 9 may employ a multi stages of comparators to sample the input signals DQ of various time node. When sampling the DQ of a time node, the comparator at each stage may correspondingly select an appropriate reference signal according to the level of the DQ of the previous time node, so as to eliminate the influence of ISI and improve the accuracy of an output result.

In some embodiments of the disclosure, as illustrated in FIG. 9, the DFE circuit 90 also includes N latches.

An input terminal of each of the N latches is connected with an output terminal of a comparator at a respective stage of the N stages to receive the comparison signal at each stage, and each of the N latches is configured to hold the comparison signal at each stage to output a latch signal at each stage.

In the embodiment of the disclosure, each of the N latches in the DFE circuit 90 may receive the comparison signal at each stage when being triggered, and may hold the comparison signal at each stage for output. For example, an ith latch 907 may receive an ith-stage comparison signal $F_i/F_iB$ when being triggered, hold the $F_i/F_iB$, and output a latch signal D.

Figure 10:
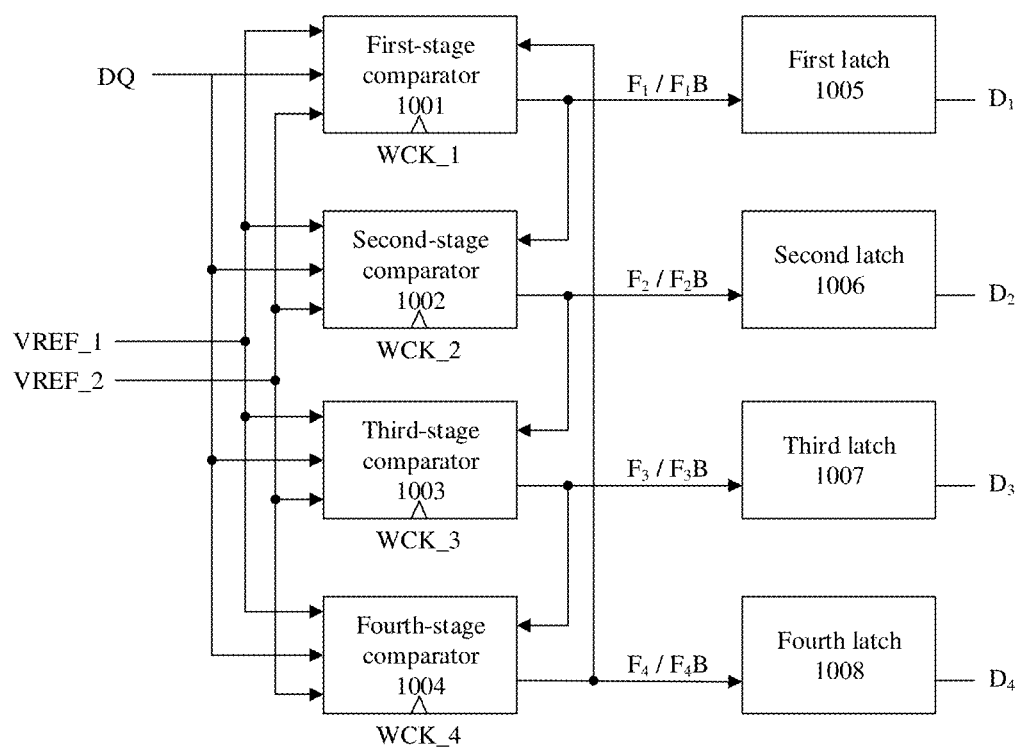
FIG. 10 is a second schematic diagram of a structure of a DFE circuit provided in an embodiment of the disclosure.

In some embodiments of the disclosure, as illustrated in FIG. 10, when N=4, the DFE circuit 100 includes four stages of comparators in the above embodiment, i.e., a first-stage comparator 1001, a second-stage comparator 1002, a third-stage comparator 1003 and a fourth-stage comparator 1004.

A first input terminal of the comparator at each stage receives an input signal DQ. A second input terminal of the comparator at each stage receives a first reference signal $V_{REF\_}1$. A third input terminal of the comparator at each stage receives a second reference signal $V_{REF\_}2$.

A fourth input terminal of the first-stage comparator 1001 is connected with an output terminal of the fourth-stage comparator 1004, to receive a fourth-stage comparison signal $F_4/F_4B$ output by the fourth-stage comparator 1004. A fifth input terminal of the first-stage comparator 1001 receives a first clock signal WCK_1.

A fourth input terminal of the second-stage comparator 1002 is connected with an output terminal of the first-stage comparator 1001, to receive a first-stage comparison signal $F_1/F_1B$ output by the first-stage comparator 1001. A fifth input terminal of the second-stage comparator 1002 receives a second clock signal WCK_2.

A fourth input terminal of the third-stage comparator 1003 is connected with an output terminal of the second-stage comparator 1002, to receive a second-stage comparison signal $F_2/F_2B$ output by the second-stage comparator 1002. A fifth input terminal of the third-stage comparator 1003 receives a third clock signal WCK_3.

A fourth input terminal of the fourth-stage comparator 1004 is connected with an output terminal of the third-stage comparator 1003, to receive a third-stage comparison signal $F_3/F_3B$ output by the third-stage comparator 1003. A fifth input terminal of the fourth-stage comparator 1004 receives a fourth clock signal WCK_4.

When being triggered by a clock signal at each stage, the comparator at each stage compares the input signal DQ with the first reference signal $V_{REF\_1}$ or compares the input signal DQ with the second reference signal $V_{REF\_2}$, according to a comparison signal corresponding to a fourth input terminal of the comparator at each stage, to output a comparison signal at each stage.

In the embodiment of the disclosure, the phase of the clock signal corresponding to the comparator at each stage is later than the phase of the clock signal corresponding to the previous-stage comparator by 90° (i.e., one quarter of the clock cycle). Therefore, the comparators of all stages sequentially sample the level of the input signals DQ of respective time nodes in a clock cycle and output the comparison signals of all stages. An interval between two adjacent time nodes is one fourth of the clock cycle. The comparator at each stage selects an appropriate reference signal from the two reference signals according to the level of the DQ of the previous time node for comparing with the level of the DQ of the current time node, so as to eliminate the influence of ISI.

In some embodiments of the disclosure, as illustrated in FIG. 10, the DFE circuit 100 also includes four latches, i.e., a first latch 1005, a second latch 1006, a third latch 1007 and a fourth latch 1008.

An input terminal of each of the four latches is connected with an output terminal of the comparator at a respective stage to receive a comparison signal at each stage, and each of the four latches is configured to hold the comparison signal at each stage to output a latch signal at each stage.

In the embodiment of the disclosure, when being triggered, each latch in the DFE circuit 100 may receive the comparison signal at each stage, and hold the comparison signal at each stage for output.

FIGS. 11 to 14 are schematic diagrams of effects of a DFE circuit provided in an embodiment of the disclosure.

Figure 11:
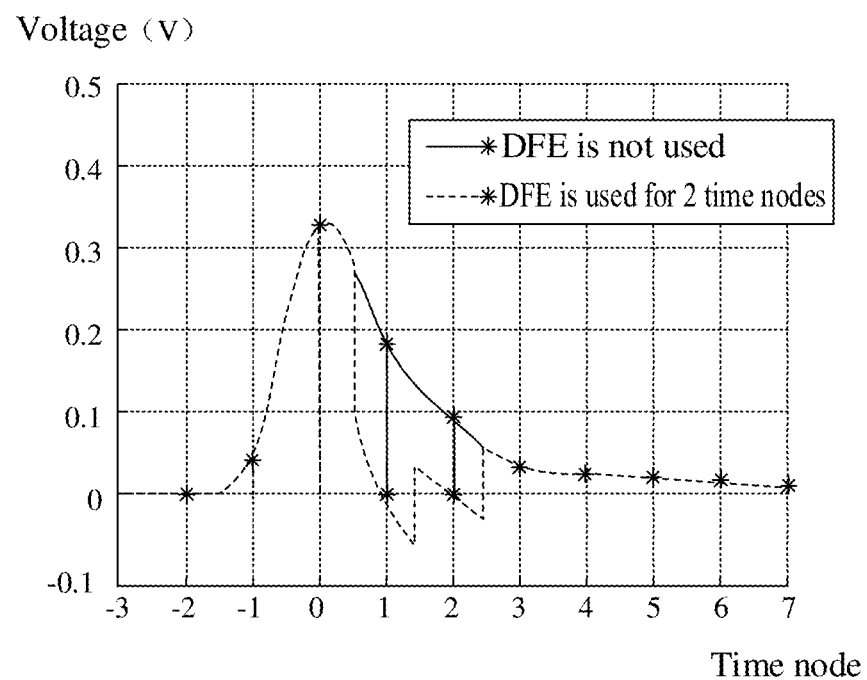
FIG. 11 is a first schematic diagram of an effect of a DFE, circuit provided in an embodiment of the disclosure.

As illustrated in FIG. 11, when DFE is not used, the voltage of a signal of a time node 0 causes ISI on the voltage of a time node 1 and the voltage of a time node 2, the low level of signals of the time node 1 and the time node 2 are pulled up, thus, the accurate voltages of the signals of the time node 1 and the time node 2 cannot be sampled. After DFE is used at the time node 1 and the time node 2, the sampled voltages are compensated by DFE and decrease to the original low level, such that the influence of ISI can be eliminate.

Figure 12:
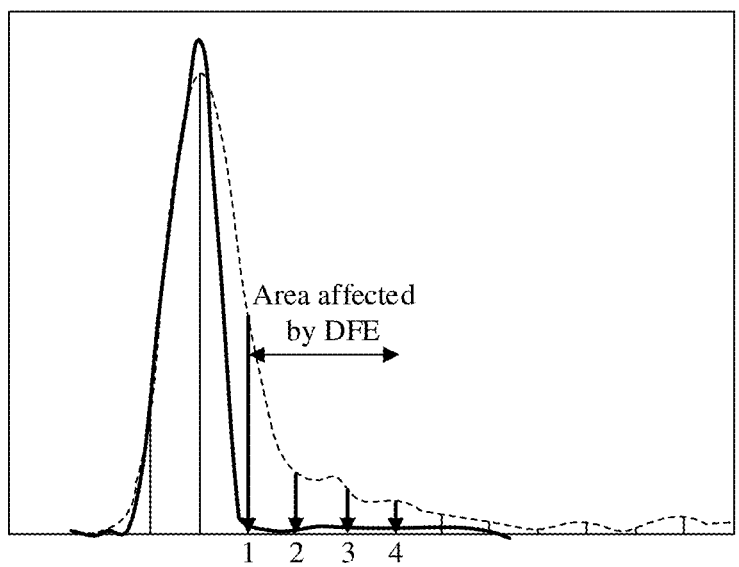
FIG. 12 is a second schematic diagram of an effect of a DFE circuit provided in an embodiment of the disclosure.

As illustrated in FIG. 12, after DFE is used at the time node 1 to time node 4, the signal is pulled down from the original dotted line to the solid line, thereby eliminating the influence of ISI caused by the high level of the signal of the previous time node.

Figure 13:
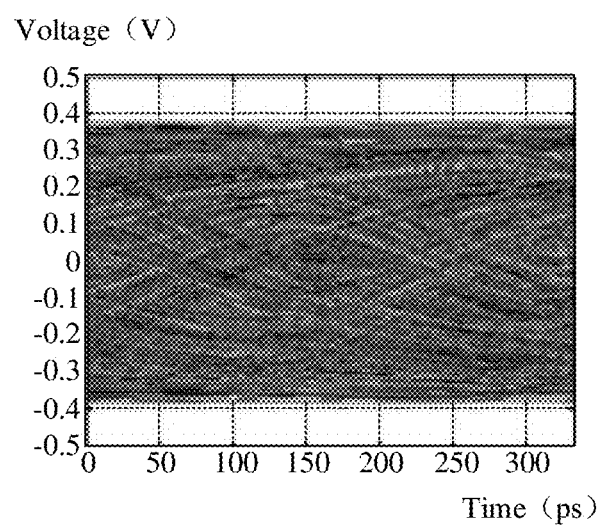
FIG. 13 is a third schematic effect diagram of an effect of a DFE circuit provided in an embodiment of the disclosure.
Figure 14:
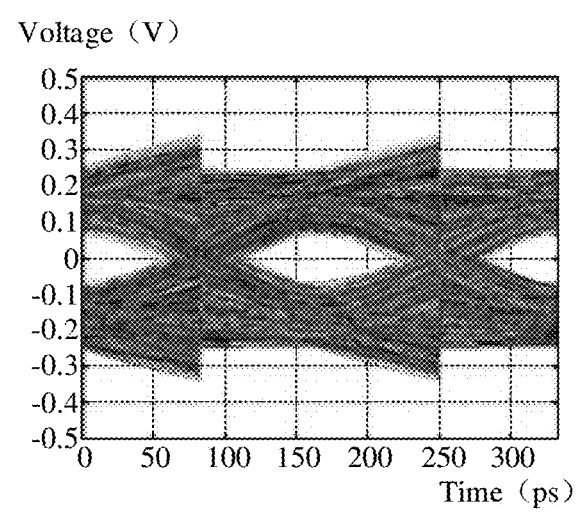
FIG. 14 is a fourth schematic effect diagram of an effect of a DFE circuit provided in an embodiment of the disclosure.

FIG. 13 and FIG. 14 respectively illustrate eye diagrams in two cases of not using DFE and using DFE. An eye diagram is formed by overlapping all symbol waveforms obtained by scanning. The influence of ISI and noise can be observed from the eye diagram. The larger the "eyes" open in the eye diagram is and the more correctitude the eye diagram is, the smaller the ISI is. Conversely, the ISI is greater. As illustrated in FIG. 13, When DFE is not used, the "eyes" in the eye diagram cannot be seen, all symbol waveforms interfere with each other and there is no apparent boundary, and ISI is very serious. As a result, an error in symbol decision may be easily caused. When DFE is used, as illustrated in FIG. 14, clear "eyes" are formed in the eye diagram, each symbol waveform has a clear boundary, and the influence of ISI is eliminated. In this way, the symbol decision can be more accurate.

It is to be noted that, in the disclosure, the terms "including", "comprising" or any other variation thereof are intended to cover non-exclusive inclusion, so that a process, method, product or device that includes not only a series of listed elements, but also other elements not explicitly listed, or elements inherent in such process, method, product or device. Without more limitations, an element defined in a statement "including a/an . . . " does not exclude existence of additional same elements in the process, the method, or the apparatus.

The above serial numbers of the embodiment of the disclosure are only for description and does not represent the priorities of the embodiments. The methods disclosed in several method embodiments provided in the disclosure may be combined arbitrarily in case of no conflict, to obtain new method embodiments. The features disclosed in several product embodiments provided in the disclosure may be combined arbitrarily in case of no conflict to obtain new product embodiments. The features disclosed in several method embodiments or device embodiments provided in the disclosure may be combined arbitrarily in case of no conflict to obtain new method embodiments or device embodiments.

The above are only detailed description of the disclosure and not intended to limit the scope of the disclosure. Modifications or replacements that are apparent to those skilled in the art within the technical scope disclosed by the embodiments of the disclosure shall fall within the scope of the disclosure. Therefore, the scope of the disclosure should be subject to the scope of protection of the claims.

INDUSTRIAL APPLICABILITY

The embodiment of the disclosure provides a comparator and a DFE circuit. The comparator includes a second-stage circuit, a first input circuit, a second input circuit, a first cross-coupled circuit and a second cross-coupled circuit. The first cross-coupled circuit is connected with the first input circuit. The second cross-coupled circuit is connected with the second input circuit. The first input circuit and the second input circuit are also connected with the second-stage circuit. The second-stage circuit is connected to a power supply terminal or a ground terminal. The first input circuit is configured to generate a first data terminal voltage and a first reference terminal voltage according to an input signal and a first reference signal in a sampling phase when being turned on. The first cross-coupled circuit is configured to perform mutual positive feedback on the first data terminal voltage and the first reference terminal voltage to generate a first differential signal. The second input circuit is configured to generate a second data terminal voltage and a second reference terminal voltage according to the input signal and a second reference signal in a sampling phase when being turned on. The second cross-coupled circuit is configured to perform mutual positive feedback on the second data terminal voltage and the second reference terminal voltage to generate a second differential signal. The second-stage circuit is configured to amplify and latch the first differential signal or the second differential signal in a regeneration phase to output a comparison signal.

According to the above solution, the first input circuit and the second input circuit are controlled to be turned on, and a more appropriate one of the first reference signal and the second reference signal is selected to be compared with the input signal. Therefore, the influence of ISI can be eliminated. Moreover, durations for the comparator to generate the first differential signal and the second differential signal in the sampling phase are respectively shortened by the first cross-coupled circuit and the second cross-coupled circuit respectively, therefore, the operating rate of the comparator can be improved.

The invention claimed is:

1. A comparator, comprising a second-stage circuit, a first input circuit, a second input circuit, a first cross-coupled circuit and a second cross-coupled circuit, wherein the first cross-coupled circuit is connected with the first input circuit; the second cross-coupled circuit is connected with the second input circuit;

the first input circuit and the second input circuit are both connected with the second-stage circuit;

the second-stage circuit is connected to a power supply terminal or a ground terminal, and wherein the first input circuit is configured to generate a first data terminal voltage and a first reference terminal voltage according to an input signal and a first reference signal in a sampling phase when being turned on;

the first cross-coupled circuit is configured to perform mutual positive feedback on the first data terminal voltage and the first reference terminal voltage to generate a first differential signal;

the second input circuit is configured to generate a second data terminal voltage and a second reference terminal voltage according to the input signal and a second reference signal in a sampling phase when being turned on;

the second cross-coupled circuit is configured to perform mutual positive feedback on the second data terminal voltage and the second reference terminal voltage to generate a second differential signal; and the second-stage circuit is configured to amplify and latch the first differential signal or the second differential signal in a regeneration phase to output a comparison signal.

2. The comparator of claim 1, wherein the first cross-coupled circuit comprises a first coupled transistor and a second coupled transistor; and the first differential signal comprises a first reference terminal output signal and a first data terminal output signal;

a first terminal of the first coupled transistor is connected with a control terminal of the second coupled transistor and a first output terminal of the first input circuit; a control terminal of the first coupled transistor is connected with a first terminal of the second coupled transistor and a second output terminal of the first input circuit; and a second terminal of the first coupled transistor is connected with a second terminal of the second coupled transistor and connected with the first input circuit;

the first coupled transistor and the second coupled transistor are both Negative-Metal-Oxide-Semiconductors (NMOSs) or Positive-Metal-Oxide-Semiconductors (PMOSs);

the first coupled transistor is configured to perform positive feedback on the first data terminal voltage according to the first reference terminal voltage in the sampling phase, to obtain the first data terminal output signal; and the second coupled transistor is configured to perform positive feedback on the first reference terminal voltage according to the first data terminal voltage in the sampling phase, to obtain the first reference terminal output signal.

3. The comparator of claim 1, wherein the second cross-coupled circuit comprises a third coupled transistor and a fourth coupled transistor; the second differential signal comprises a second reference terminal output signal and a second data terminal output signal;

a first terminal of the third coupled transistor is connected with a control terminal of the fourth coupled transistor and a first output terminal of the second input circuit; a control terminal of the third coupled transistor is connected with a first terminal of the fourth coupled transistor and a second output terminal of the second input circuit; and a second terminal of the third coupled transistor is connected with a second terminal of the fourth coupled transistor and connected with the second input circuit;

the third coupled transistor and the fourth coupled transistor are both Negative-Metal-Oxide-Semiconductors (NMOSs) or Positive-Metal-Oxide-Semiconductors (PMOSs);

the third coupled transistor is configured to perform positive feedback on the second data terminal voltage according to the second reference terminal voltage in the sampling phase, to obtain the second data terminal output signal; and the fourth coupled transistor is configured to perform positive feedback on the second reference terminal voltage according to the second data terminal voltage in the sampling phase, to obtain the second reference terminal output signal.

4. The comparator of claim 1, wherein the first input circuit comprises a first input transistor, a second input transistor and a third input transistor;

a first terminal of the first input transistor and a first terminal of the second input transistor are respectively connected with the second-stage circuit;

a second terminal of the first input transistor and a second terminal of the second input transistor are both connected with a first terminal of the third input transistor;

the first input transistor, the second input transistor and the third input transistor are Negative-Metal-Oxide-Semiconductors (NMOSs) or Positive-Metal-Oxide-Semiconductors (PMOSs);

a control terminal of the first input transistor receives the input signal; a control terminal of the second input transistor receives the first reference signal; and a control terminal of the third input transistor receives a first feedback signal; and in response to the third input transistor being triggered to be turned on by the first feedback signal, the first input transistor generates the first data terminal voltage according to the input signal, and applies the first data terminal voltage to a control terminal of a second coupled transistor, and the second input transistor generates the first reference terminal voltage according to the first reference signal, and applies the first reference terminal voltage to a control terminal of a first coupled transistor.

5. The comparator of claim 1, wherein the second input circuit comprises a fourth input transistor, a fifth input transistor and a sixth input transistor;

a first terminal of the fourth input transistor and a first terminal of the fifth input transistor are respectively connected with the second-stage circuit;

a second terminal of the fourth input transistor and a second terminal of the fifth input transistor are both connected with a first terminal of the sixth input transistor;

the fourth input transistor, the fifth input transistor and the sixth input transistor are Negative-Metal-Oxide-Semiconductors (NMOSs) or Positive-Metal-Oxide-Semiconductors (PMOSs);

a control terminal of the fourth input transistor receives the input signal; a control terminal of the fifth input transistor receives the second reference signal; and a control terminal of the sixth input transistor receives a second feedback signal; and in response to the sixth input transistor being triggered to be turned on by the second feedback signal, the fourth input transistor generates the second data terminal voltage according to the input signal, and applies the second data terminal voltage to a control terminal of a fourth coupled transistor, and the fifth input transistor generates the second reference terminal voltage according to the second reference signal, and applies the second reference terminal voltage to a control terminal of a third coupled transistor.

6. The comparator of claim 1, further comprising a first reset circuit and a clock switch circuit, wherein the first reset circuit is connected with the first input circuit and the second input circuit; and the first reset circuit is further connected to the power supply terminal or the ground terminal;

the clock switch circuit is connected with the first input circuit and the second input circuit; and the clock switch circuit is further connected to the ground terminal or the power supply terminal;

the first reset circuit is configured to reset the first input circuit and the second input circuit in a resetting phase; and the clock switch circuit is configured to control the comparator to be turned on under trigger of a clock signal.

7. The comparator of claim 6, wherein the first reset circuit comprises a first reset transistor and a second reset transistor;

a first terminal of the first reset transistor and a first terminal of the second reset transistor are both connected to the power supply terminal or the ground terminal; a second terminal of the first reset transistor is connected with the first input circuit; and a second terminal of the second reset transistor is connected with the second input circuit;

the first reset transistor and the second reset transistor are both Negative-Metal-Oxide-Semiconductors (NMOSs) or Positive-Metal-Oxide-Semiconductors (PMOSs);

a control terminal of the first reset transistor and a control terminal of the second reset transistor both receive the clock signal; and in response to the first reset transistor and the second reset transistor being triggered to be turned on by the clock signal, the first input circuit is connected to the power supply terminal or the ground terminal through the first reset transistor to reset the first input circuit, and the second input circuit is connected to the power supply terminal or the ground terminal through the second reset transistor to reset the second input circuit.

8. The comparator of claim 6, wherein the clock switch circuit comprises a clock switch transistor;

a first terminal of the clock switch transistor is connected with the first input circuit and the second input circuit; a second terminal of the clock switch transistor is connected to the ground terminal or the power supply terminal;

the clock switch transistor is a Negative-Metal-Oxide-Semiconductor (NMOS) or a Positive-Metal-Oxide-Semiconductor (PMOS);

a control terminal of the clock switch transistor receives the clock signal; and in response to the clock switch transistor being triggered to be turned on by the clock signal, the first input circuit and the second input circuit are connected to the ground terminal or the power supply terminal through the clock switch transistor, to turn on the comparator.

9. The comparator of claim 1, wherein the second-stage circuit comprises an output circuit and a second reset circuit;

the second reset circuit is connected with the output circuit; the output circuit is connected to the power supply terminal or the ground terminal; and the second reset circuit is connected to the power supply terminal or the ground terminal;

the output circuit is configured to amplify and latch the first differential signal or the second differential signal in the regeneration phase to output the comparison signal; and the second reset circuit is configured to reset the output circuit in a resetting phase.

10. The comparator of claim 9, wherein the second reset circuit comprises a third reset transistor and a fourth reset transistor;

a first terminal of the third reset transistor and a first terminal of the fourth reset transistor are both connected to the power supply terminal or the ground terminal; a second terminal of the third reset transistor and a second terminal of the fourth reset transistor are respectively connected to the output circuit; and the third reset transistor and the fourth reset transistor are both Negative-Metal-Oxide-Semiconductors (NMOSs) or Positive-Metal-Oxide-Semiconductors (PMOSs);

a control terminal of the third reset transistor and a control terminal of the fourth reset transistor receive a clock signal; and in response to the third reset transistor and the fourth reset transistor being triggered to be turned on by the clock signal, the output circuit is connected to the power supply terminal or the ground terminal through the third reset transistor and the fourth reset transistor, to reset the output circuit.

11. The comparator of claim 9, wherein the output circuit comprises a first output transistor, a second output transistor, a third output transistor, a fourth output transistor, a fifth output transistor and a sixth output transistor;

a control terminal of the first output transistor, a first terminal of the second output transistor, a control terminal of the third output transistor, a second terminal of the fourth output transistor and a second terminal of the sixth output transistor are all connected with a first output terminal of the output circuit;

a first terminal of the first output transistor, a control terminal of the second output transistor, a second terminal of the third output transistor, a control terminal of the fourth output transistor and a second terminal of the fifth output transistor are all connected with a second output terminal of the output circuit;

a second terminal of the first output transistor is connected with the first input circuit, the second input circuit and the second reset circuit, and a second terminal of the second output transistor is connected with the first input circuit, the second input circuit and the second reset circuit;

a first terminal of the third output transistor, a first terminal of the fourth output transistor, a first terminal of the fifth output transistor and a first terminal of the sixth output transistor are all connected to the power supply terminal or the ground terminal;

the first output transistor and the second output transistor are both NMOSs or PMOSs; the third output transistor, the fourth output transistor, the fifth output transistor and the sixth output transistor are all PMOSs or NMOSs; and a control terminal of the fifth output transistor and a control terminal of the sixth output transistor receive a clock signal.

12. The comparator of claim 1, wherein
a voltage of the first reference signal is higher than or lower than a voltage of the second reference signal.

13. A Decision Feedback Equalization (DFE) circuit, comprising N stages of comparators of claim 1, wherein N is a positive integer greater than 1; wherein a first input terminal of a comparator at each stage receives an input signal; a second input terminal of the comparator at each stage receives a first reference signal; and a third input terminal of the comparator at each stage receives a second reference signal;

a fourth input terminal of a first-stage comparator is connected with an output terminal of an Nth-stage comparator to receive an Nth-stage comparison signal output by the Nth-stage comparator; a fifth input terminal of the first-stage comparator receives a first clock signal;

a fourth input terminal of an ith-stage comparator is connected with an output terminal of an (i−1)th-stage comparator to receive an (i−1)th-stage comparison signal output by the (i−1)th-stage comparator; a fifth input terminal of the ith-stage comparator receives an ith clock signal, wherein i is greater than 1 and less than or equal to N; and under trigger of a clock signal at each stage, the comparator at each stage compares the input signal with the first reference signal or compares the input signal with the second reference signal according to a comparison signal corresponding to a fourth input terminal of the comparator at each stage, to output a comparison signal at each stage.

14. The DFE circuit of claim 13, wherein
a phase of the ith clock signal is 360°/N later than a phase of the (i−1)th clock signal.

15. The DFE circuit of claim 13, wherein
when N=4, a fourth input terminal of the first-stage comparator is connected with an output terminal of an fourth-stage comparator to receive a fourth-stage comparison signal output by the fourth-stage comparator; and a fifth input terminal of the first-stage comparator receives a first clock signal.

16. The DFE circuit of claim 13, further comprising N latches, wherein an input terminal of each of the N latches is connected with an output terminal of a comparator at a respective stage of the N stages to receive the comparison signal at each stage; and each of the N latches is configured to hold the comparison signal at each stage to output a latch signal at each stage.

* * * * *